(12) United States Patent
Kubota et al.

(10) Patent No.: US 8,227,043 B2
(45) Date of Patent: Jul. 24, 2012

(54) LIQUID DISCHARGE HEAD MANUFACTURING METHOD, AND LIQUID DISCHARGE HEAD OBTAINED USING THIS METHOD

(75) Inventors: Masahiko Kubota, Tokyo (JP); Takumi Suzuki, Kanagawa (JP); Tamaki Sato, Kanagawa (JP); Ryoji Kanri, Kanagawa (JP); Maki Hatta, Tokyo (JP); Kazuhiro Asai, Kanagawa (JP); Shoji Shiba, Kanagawa (JP); Etsuko Hino, Kanagawa (JP); Hiroe Ishikura, Kanagawa (JP); Akihiko Okano, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1066 days.

(21) Appl. No.: 10/565,658

(22) PCT Filed: Jun. 27, 2005

(86) PCT No.: PCT/JP2005/012267
§ 371 (c)(1),
(2), (4) Date: Jan. 24, 2006

(87) PCT Pub. No.: WO2006/001531
PCT Pub. Date: Jan. 5, 2006

(65) Prior Publication Data
US 2006/0277755 A1 Dec. 14, 2006

(30) Foreign Application Priority Data

Jun. 28, 2004 (JP) .................................. 2004-190483

(51) Int. Cl.
*B05D 1/36* (2006.01)
*B05D 7/00* (2006.01)
(52) U.S. Cl. ............. 427/407.1; 427/487; 427/496; 427/504; 427/508; 427/510; 427/517; 427/58; 29/890.1

(58) Field of Classification Search ............. 427/407.1, 427/487, 496, 504, 508, 510, 517, 58
See application file for complete search history.

(56) References Cited

U.S. PATENT DOCUMENTS
4,004,043 A 1/1977 Hiraoka
(Continued)

FOREIGN PATENT DOCUMENTS
CN 1476977 2/2004
(Continued)

OTHER PUBLICATIONS

J.V. Crivello et al., "New Photoinitiators for Cationic Polymerization," Fourth International Symposium on Cationic Polymerization, *J. Polymer Sci.*: Symposium No. 56, pp. 383-395 (1976).

*Primary Examiner* — Nadine G Norton
*Assistant Examiner* — Mahmoud Dahimene
(74) *Attorney, Agent, or Firm* — Fitzpatrick, Cella, Harper & Scinto

(57) ABSTRACT

A method for manufacturing a liquid discharge head includes the steps of: forming a solid layer for forming a flow path on a substrate on which an energy generating element is arranged to generate energy that is used to discharge liquid; forming, on the substrate where the solid layer is mounted, a coating layer for coating the solid layer; forming a discharge port used to discharge a liquid, through a photolithographic process, in the coating layer deposited on the solid layer; and removing the solid layer to form a flow path that communicates with the energy element and the discharge port. A material used for the coating layer contains a cationically polymerizable chemical compound, a cationic photopolymerization initiator and an inhibitor of cationic photopolymerization, and a material of the solid layer that forms a boundary with a portion where the discharge port of the coating layer is formed contains a copolymer of methacrylic acid and methacrylate ester.

7 Claims, 14 Drawing Sheets

U.S. PATENT DOCUMENTS

| | | | |
|---|---|---|---|
| 4,565,859 A | 1/1986 | Murai et al. | |
| 5,347,713 A | 9/1994 | Shibata et al. | |
| 5,478,606 A | 12/1995 | Ohkuma et al. | |
| 5,491,505 A | 2/1996 | Suzuki et al. | |
| 5,523,383 A * | 6/1996 | Ikeda et al. | 528/345 |
| 5,649,359 A | 7/1997 | Murakami et al. | |
| 5,703,630 A | 12/1997 | Murakami et al. | |
| 5,916,452 A | 6/1999 | Kobayashi et al. | |
| 6,041,501 A | 3/2000 | Suzuki et al. | |
| 6,055,729 A | 5/2000 | Suzuki | |
| 6,062,678 A | 5/2000 | Ishinaga et al. | |
| 6,082,612 A | 7/2000 | Black | |
| 6,095,640 A | 8/2000 | Ishinaga et al. | |
| 6,109,718 A | 8/2000 | Murakami et al. | |
| 6,123,863 A | 9/2000 | Shimomura et al. | |
| 6,137,510 A | 10/2000 | Sato et al. | |
| 6,142,606 A | 11/2000 | Kubota et al. | |
| 6,196,667 B1 | 3/2001 | Hiroki et al. | |
| 6,241,335 B1 | 6/2001 | Suzuki | |
| 6,290,335 B1 | 9/2001 | Kawai et al. | |
| 6,293,655 B1 | 9/2001 | Imanaka et al. | |
| 6,315,853 B1 | 11/2001 | Kubota et al. | |
| 6,318,842 B1 | 11/2001 | Shimomura et al. | |
| 6,331,051 B1 | 12/2001 | Tajima et al. | |
| 6,374,482 B1 | 4/2002 | Mihara et al. | |
| 6,378,993 B1 | 4/2002 | Ozaki et al. | |
| 6,386,686 B1 | 5/2002 | Kubota et al. | |
| 6,402,302 B1 | 6/2002 | Ozaki et al. | |
| 6,426,481 B1 | 7/2002 | Koide et al. | |
| 6,435,661 B1 | 8/2002 | Inoue et al. | |
| 6,435,670 B1 | 8/2002 | Inoue et al. | |
| 6,439,700 B1 | 8/2002 | Ishinaga et al. | |
| 6,450,616 B1 | 9/2002 | Kubota et al. | |
| 6,454,379 B1 | 9/2002 | Taneya et al. | |
| 6,464,342 B1 | 10/2002 | Kubota et al. | |
| 6,464,345 B2 | 10/2002 | Kubota et al. | |
| 6,467,863 B1 | 10/2002 | Imanaka et al. | |
| 6,472,125 B1 | 10/2002 | Koide et al. | |
| 6,474,769 B1 | 11/2002 | Imanaka et al. | |
| 6,485,132 B1 | 11/2002 | Hiroki et al. | |
| 6,491,380 B2 | 12/2002 | Taneya et al. | |
| 6,497,475 B1 | 12/2002 | Kubota et al. | |
| 6,508,538 B2 | 1/2003 | Suzuki et al. | |
| 6,513,911 B1 | 2/2003 | Ozaki et al. | |
| 6,533,400 B1 | 3/2003 | Kudo et al. | |
| 6,540,316 B1 | 4/2003 | Imanaka et al. | |
| 6,540,330 B1 | 4/2003 | Kubota et al. | |
| 6,540,336 B2 | 4/2003 | Kubota et al. | |
| 6,609,783 B1 | 8/2003 | Koyama et al. | |
| 6,631,970 B2 | 10/2003 | Sato et al. | |
| 6,663,229 B2 | 12/2003 | Komuro et al. | |
| 6,688,729 B1 | 2/2004 | Imanaka et al. | |
| 6,752,487 B1 | 6/2004 | Kubota et al. | |
| 6,769,754 B2 | 8/2004 | Imanaka et al. | |
| 6,786,572 B2 | 9/2004 | Imanaka et al. | |
| 6,799,838 B2 | 10/2004 | Kubota et al. | |
| 6,811,715 B2 | 11/2004 | Suzuki | |
| 6,834,943 B2 | 12/2004 | Mihara et al. | |
| 6,854,831 B2 | 2/2005 | Kubota et al. | |
| 6,895,668 B2 | 5/2005 | Imamura | |
| 6,910,760 B2 | 6/2005 | Kubota et al. | |
| 6,945,633 B2 | 9/2005 | Imanaka et al. | |
| 6,945,635 B2 | 9/2005 | Kubota et al. | |
| 6,951,380 B2 | 10/2005 | Kubota et al. | |
| 6,960,424 B2 | 11/2005 | Miyagawa et al. | |
| 6,971,171 B2 | 12/2005 | Komuro et al. | |
| 6,986,980 B2 | 1/2006 | Kubota et al. | |
| 7,036,909 B2 | 5/2006 | Kubota et al. | |
| 7,048,358 B2 | 5/2006 | Kubota et al. | |
| 7,187,024 B2 | 3/2007 | Kobayashi et al. | |
| 7,629,111 B2 * | 12/2009 | Kubota et al. | 430/320 |
| 2002/0019500 A1 | 2/2002 | Roth et al. | |
| 2003/0215743 A1* | 11/2003 | Goto | 430/271.1 |
| 2004/0072107 A1* | 4/2004 | Kubota et al. | 430/320 |
| 2004/0131957 A1* | 7/2004 | Kubota et al. | 430/15 |
| 2004/0214945 A1* | 10/2004 | Uozumi | 524/551 |
| 2005/0082943 A1 | 4/2005 | Kubota et al. | |
| 2005/0181309 A1 | 8/2005 | Miyagawa et al. | |
| 2005/0248623 A1 | 11/2005 | Komuro et al. | |
| 2006/0098051 A1 | 5/2006 | Kubota et al. | |
| 2006/0114295 A1 | 6/2006 | Asai et al. | |
| 2006/0125877 A1 | 6/2006 | Kubota et al. | |
| 2006/0125884 A1 | 6/2006 | Sato et al. | |
| 2006/0127813 A1 | 6/2006 | Ohkuma et al. | |
| 2006/0132539 A1 | 6/2006 | Hino et al. | |
| 2007/0085877 A1 | 4/2007 | Ohkuma et al. | |

FOREIGN PATENT DOCUMENTS

| | | | |
|---|---|---|---|
| EP | 0 411 839 A | | 2/1991 |
| EP | 1 380 422 A | | 1/2004 |
| EP | 1 380 422 A1 * | | 1/2004 |
| EP | 1 380 423 A | | 1/2004 |
| EP | 1 380 425 A | | 1/2004 |
| GB | 2 278 845 A | | 12/1994 |
| JP | 60-161973 A | | 8/1985 |
| JP | 63-221121 A | | 9/1988 |
| JP | 64-9216 A | | 1/1989 |
| JP | 2-140219 A | | 5/1990 |
| JP | 6-286149 A | | 10/1994 |
| JP | 09183928 A * | | 7/1997 |
| JP | 2000-326515 A | | 11/2000 |
| JP | 3143307 B2 | | 12/2000 |
| JP | 2001-179990 | | 7/2001 |
| JP | 2003-25595 A | | 1/2003 |
| JP | 2004-42396 | | 2/2004 |
| JP | 2004-42399 | | 2/2004 |
| JP | 2004-042650 | | 2/2004 |
| JP | 2004-046217 | | 2/2004 |

* cited by examiner

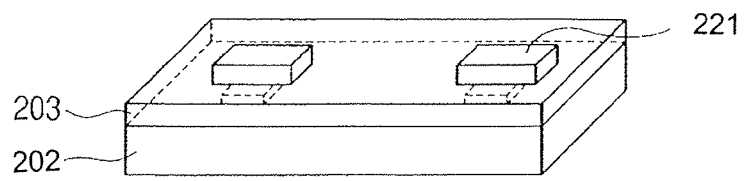
FIG. 9E
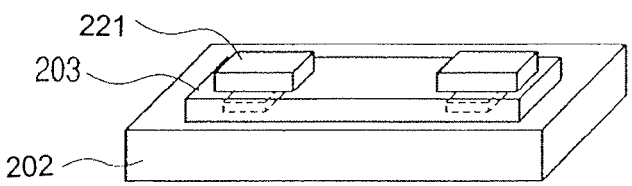
FIG. 9F
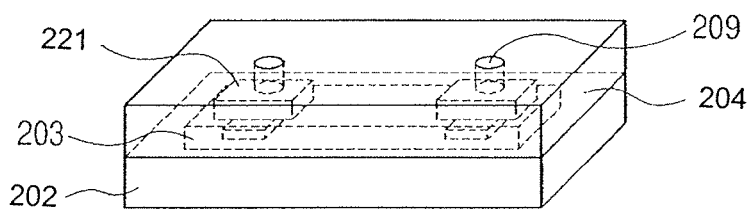
FIG. 9G
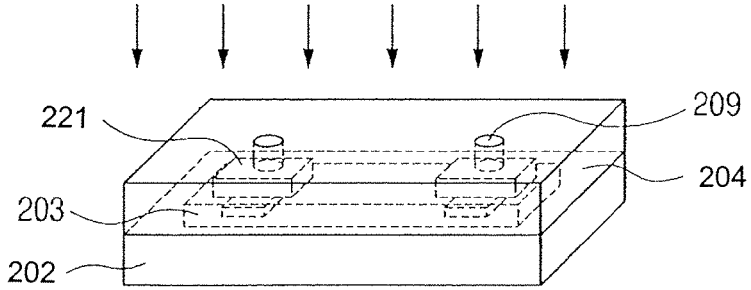
FIG. 9H
FIG. 9I
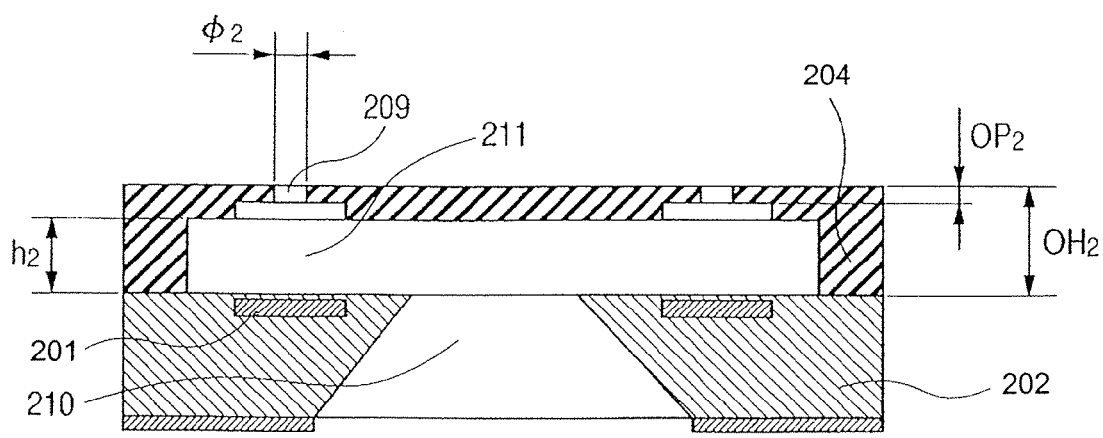

LIQUID DISCHARGE HEAD MANUFACTURING METHOD, AND LIQUID DISCHARGE HEAD OBTAINED USING THIS METHOD

TECHNICAL FIELD

The present invention relates to a liquid discharge head manufacturing method, and a liquid discharge head obtained using this manufacturing method. Specifically, the present invention relates to a method for manufacturing a liquid discharge (ejection) recording head that ejects a liquid and performs recording, and a liquid discharge (ejection) recording head obtained using this manufacturing method.

BACKGROUND ART

Generally, liquid ejection recording heads (including ink jet recording heads and ink jet heads) employing a liquid ejection recording system (including an ink jet recording system) comprise a plurality of tiny discharge ports, a plurality of flow paths and a plurality of liquid discharge means provided along part of these flow paths. In order to eject ink from the liquid ejection recording head onto recording paper to obtain high quality images, it is preferable that the same volume of ink be discharged at the same discharge speed from the individual discharge ports. Further, the shape of the boundary face between each discharge port and the corresponding communication flow path must not adversely affect the discharge of ink.

As a method for manufacturing an ink jet recording head, a method is described in Japanese Patent Application Laid-Open No. H6-286149, according to which an ink flow path pattern is formed—by using a dissolvable resin, and is coated by an epoxy resin, and according to which, thereafter, discharge ports are formed and the dissolvable resin is removed. Further, another method is disclosed in Japanese Patent Application Laid-Open No. 2001-179990, according to which a substance that inhibits photo curing of a discharge port formation material is mixed with a removable resin.

For the discharge of extremely small droplets, a liquid flow resistance at the discharge port of the liquid ejection recording head must be reduced, and the liquid ejection speed must be maintained. In Japanese Patent Application Laid-Open No. 2003-25595, an idea is disclosed according to which two layers of dissolvable resin are formed, and an intermediate portion (an intermediate chamber), narrower than substrate flow paths and wider than distal ends of the discharge ports, is provided between the substrate flow paths and the distal ends of the discharge ports.

Recently, as the image quality of ink jet (IJ) printers has become highly competitive, the size of ink droplets to be discharged has been reduced. And as the size of ink droplets has been reduced, the diameter of the orifice (the diameter of the discharge port, of the IJ head) that discharges ink droplets has also become smaller. However, in the cross section of a conventional IJ head shown in FIG. 13A, when the diameter of a discharge port 909 is reduced without its thickness PH (OP thickness) being changed, the flow resistance of ink at the discharge port 909 is increased in proportion to the square of the diameter of the discharge port 909. As a result, when the discharge of ink is started, following a pause, e.g., after the printer has been halted, the characteristic of the discharge of ink droplets tends to be deteriorated at the first discharge (this phenomenon is called an "incomplete discharge phenomenon"). It should be noted that in FIGS. 13A, 13B and 13C the other components are a substrate 901, a heat generating resistor 902 and a flow path formation member 907, and that MH denotes a flow path height.

In order to stably launch small droplets, the present inventors attempted to manufacture a small droplet nozzle wherein, as shown in FIGS. 13B and 13C, the diameter of a discharge port was small and the OP thickness (PH) was reduced (e.g., about PH≦10 µm). When this ink jet recording head was manufactured, however, using the methods described in the above-described patent publications, new technical problems were found.

Specifically, as one phenomenon, a scum occurs at the interface between a removable resin and a discharge port formation material used for forming ink discharge ports, and the direction in which ink droplets are ejected from the discharge port faces is bent, so that a printed image is deteriorated. This phenomenon could not be resolved using the method disclosed in Japanese Patent Application Laid-Open No. 2001-179990.

The present inventors thoroughly studied this phenomenon and arrived at the following conclusion. The discharge port formation material is a negative type resist, and the discharge ports are formed during the photolithography process. That is, since the negative type resist is employed to form a cured layer, including discharge ports, UV light irradiation is performed through a mask (not shown) for an area other than the discharge ports. At this time, the amount of light irradiating a unit area is larger in an area wherein the removable resin is present than in an area wherein the resin is not present. When the diameter of a discharge port is small, during light irradiation, the amount of light (per unit area) that reaches an unexposed portion (a discharge port area) is increased.

As a result, for a shape wherein the flow path height is extended and the PH (OP thickness) is thin, the difference in the amount of irradiated light is increased even more. Through an analysis of the cross section of the minute discharge port, it was found the scum could be clearly observed at the interface between the removable resin and the discharge port formation material used for forming ink discharge ports Based on the above new view, the present inventors realized that there was a problem with the complete removal of a scum that occurs at the interface between a removable resin and a discharge port formation material, used for forming ink discharge ports having the nozzle shape of an IJ head, as shown in FIGS. 13B and 13C, whereat the difference in the amount of irradiated light is increased.

DISCLOSURE OF THE INVENTION

While taking the above shortcoming into account, the objective of the present invention is to provide a method for manufacturing a liquid discharge head whereby a dissolvable and removable solid layer, which is a mold for defining a flow path pattern, and a discharge port formation material layer, which coats the solid layer, are employed, and whereby a scum does not occur at the interface whereat these layers make direct contact, and small droplets (including extremely small droplets) are accurately discharged at the discharge ports and a liquid ejection head obtained using this manufacturing method.

To achieve this objective, according to the invention, a method for manufacturing a liquid discharge head comprises the steps of:

forming a solid layer, for forming a flow path, on a substrate on which an energy generating element is arranged to generate energy that is used to discharge liquid;

forming, on the substrate whereon the solid layer is mounted, a coating layer for coating the solid layer;

forming a discharge port used to discharge a liquid, through a photolithography process, in the coating layer deposited on the solid layer; and removing the solid layer to form a flow path that communicates with the energy element and the discharge port, whereby a material used for the coating layer contains a cationically polymerizable chemical compound, a cationic photopolymerization initiator and an inhibitor of cationic photopolymerization, and whereby a material used for the solid layer that forms a boundary, with a portion wherein the discharge port of the coating layer are formed, contains a copolymer of methacrylic acid and methacrylate ester.

A liquid discharge head according to this invention is manufactured using the above described manufacturing method, and a discharge port formation material for forming a discharge port for this head contains a cationically polymerizable chemical compound, a cationic photopolymerization initiator and an inhibitor of cationic photopolymerization.

Further features and advantages of the present invention will become apparent from the following description of exemplary embodiments (with reference to the attached drawings)

BRIEF DESCRIPTION OF THE DRAWINGS

FIGS. 9A, 9B, 9C, 9D, 9E, 9F, 9G, 9H and 9I are diagrams showing the processing for forming ink flow paths according to a fourth embodiment of the present invention;

BEST MODE FOR CARRYING OUT THE INVENTION

The present invention will now be described by employing, as an example liquid discharge head, an ink jet head (IJ head) that performs recording using ink. However, the liquid discharge head for this invention may be a type that can also employ various kinds of liquids, for a variety of surfaces, for purposes other than recording. In the specifications for this invention, ionizing radiation is a general term for radiation, such as by Deep-UV light, electrons or X rays, that affects the ionization of a material (Explanation of a Scum Production Mechanism)

Figure 14A:
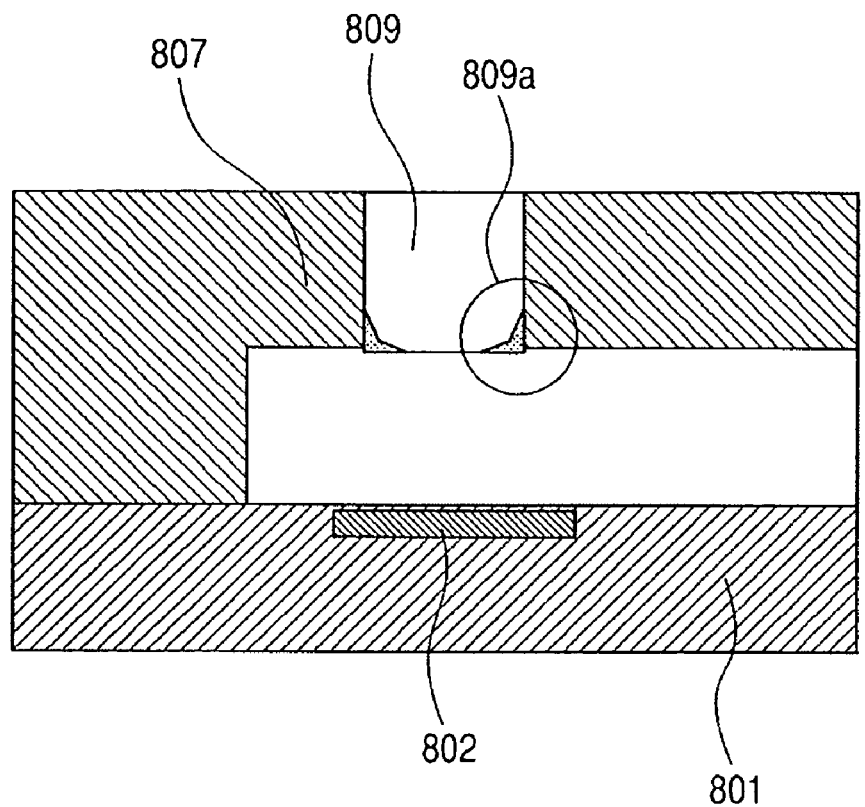
FIGS. 14A and 14B are diagrams for specifically explaining a scum occurrence state.
Figure 14B:
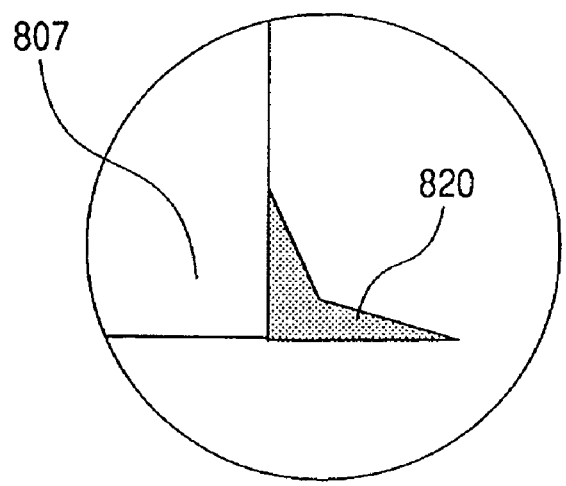

First, an explanation will be given for a new view by the present inventors concerning a mechanism wherein a scum occurs at the interface between a solid layer, which is formed by using a removable resin, and a coating layer, which is formed by using a discharge port formation material for forming ink discharge ports. The present inventors have assumed that, for the mechanism, two factors cause scum to occur (see FIGS. 14A and 14B). In FIGS. 14A and 14B, reference numeral 801 denotes a substrate; 802, a heat generation resistor; 807, an ink flow path formation member; and 809, a discharge port. Scum 820 occurs in a lower portion 809a of the discharge port 809.

(1): When light is projected onto the coating layer, which is formed by using a photo curing composite that is a cationically polymerizable, nozzle formation material, the light spreads along the interface between the solid layer and the coating layer into the area, blocked by a mask, in which discharge ports are to be formed, and as a result, a tiny cured portion is generated.

(2): At the interface between the solid layer and the coating layer for forming am ink discharge port, a compatible layer is formed of the materials used for these layers, and the presence of this layer causes scum to occur.

These two factors do not individually contribute to the occurrence of the scum, but when combined, may be related to the occurrence of the scum. Thus, it is the understanding of the present inventors that, to eliminate the scum, it is important that the problems posed by the two factors be resolved at the same time.

The present inventors carefully studied the nozzle shape of an IJ head whereat there was no scum, and took the following measures to resolve the problems posed by the above described assumed factors.

Measure 1: An inhibitor of cationic photopolymerization was added to a discharge port formation material that contains a cationic photopolymerizable chemical compound and a cationic photopolymerization initiator. With the inhibitor of cationic photopolymerization, upon the irradiation with light, a photopolymerizable reaction was adjusted at the interface between the exposed portion and the non-exposed portion, and cationic polymerizable reaction was inhibited by the light that reached the non-exposed portion.

Measure 2: The resistance of a resin used for forming a solid layer was increased relative to a solvent contained in a coating liquid used for forming a coating layer made of a discharge port formation material.

By applying measures 1 and 2 at the same time, when IJ nozzles of various types and having various shapes were formed, scum did not occur at the interface between the removable resin and the nozzle formation material used for forming ink discharge ports (Explanation of a Photosensitive Material)

In this invention, a positive type photosensitive composite, the resin element of which is a copolymer of methacrylic acid and methacrylate ester, is at least employed as a solid layer that is the mold for a flow path pattern. This copolymer is obtained by radical polymerization of methacrylic acid and methacrylate ester, and contains a unit (B) obtained from methacrylic acid, and a unit (A) obtained from methacrylate ester, in the following chemical formula. The ratio of the unit (B) to the copolymer can be selected from a range preferably of 5 to 30 mass %, and more preferably, 8 to 12 mass %.

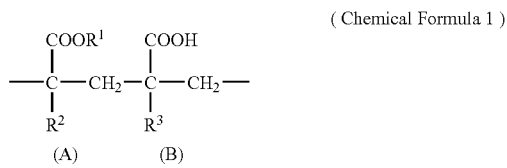

(Chemical Formula 1)

$R^2$ in the element methacrylate ester represents an alkyl group having carbon numbers of one to three, and R1 represents an alkyl group having carbon numbers of one to three. $R^3$ in the element methacrylic acid represents an alkyl group having carbon numbers of one to three. Independently, $R^1$ to $R^3$ have the above definition for the individual units That is, multiple units (A) may contain the same R1 and the same $R^2$, or a combination in which, at the least, either $R^1$ or $R^2$ is different may be included in multiple units (A). This also applies for the unit (B). The copolymer is not especially limited, so long as it consists of the units of (A) and (B), and the polymerization form can be random polymerization or block polymerization, and is not especially limited, so long as a desired characteristic of a positive type resist is obtained. Further, it is preferable that the molecular weight of the copolymer be 50000 to 300000 (weight average) and that the degree of dispersion be 1.2 to 4.0.

It is preferable that an area of 200 to 260 nm be the only absorbed wavelength area for decomposition of the resin element of this photosensitive resin composite. Further, for the development, after light irradiation, of a liquid mixture of diethylene glycol, morpholine, monoethanolamine and pure water can be employed.

On the other hand, for a laminated structure of multiple solid layers, e.g., two solid layers that have a stair shaped stepped portion, the upper layer is formed of a resin composite that contains a copolymer of methacrylic acid and methyl methacrylate The lower layer is formed of a positive type resin composite, a photosensitive wavelength (an absorbed wavelength) of which differs from that of the copolymer of methacrylic acid and methyl methacrylate, and with which the copolymer contained in the upper layer is not decomposed while the lower layer is exposed. Polymethylisopropenylketone, for example, is preferable as the resin element of the resin composite for the lower layer.

A photocurable composite that contains a cationically polymerizable chemical compound, a cationic photopolymerization initiator and an inhibitor of cationic photopolymerization is employed as a curable composite of a negative photosensitive type as a discharge port formation material. The cationically polymerizable chemical compound contained in the photocurable composite is used to combine compounds by using a cationic addition polymerization reaction. For example, an epoxy compound in the solid state at normal temperature, described in Japanese Patent No. 3143307, can be appropriately employed. This epoxy compound can, for example, be a reactant of bisphenol A and epichlorohydrin, the molecular weight of which is, at the least, about 900, a reactant of bromine-containing phenol A and epichlorohydrin, a reactant of phenolnovolac or ortho-cresolnovolac and epichlorohydrin, or a multi-reactive epoxy resin having an oxycyclohexane framework described in Japanese Patent Application Laid-Open Nos. S60-161973, S63-221121, S64-9216 and H2-140219, and one or more of two types of these epoxy compounds can be employed. Further, for these epoxy compounds, preferably, the equivalent epoxy weight is equal to or smaller than 2000, or more preferably, is equal to or smaller than 1000. This is because, when the equivalent epoxy weight exceeds 2000, the bridge density is reduced as a result of the curing reaction, and either Tg, or the heat deflection temperature of the cured product, will be reduced, or the adhesiveness and the ink resistance will be deteriorated.

The cationic photopolymerization initiator can be, for example, an aromatic iodonium salt or an aromatic sulfonium salt (see J. POLYMER SCI: Symposium No. 56 383-395 (1976)), or SP-150 or SP-170, marketed by Asahi Denka Kogyo Kabushiki Kaisha. When the cationic photopolymerization initiator, together with a reducing agent, is heated, the cationic addition polymerization reaction can be accelerated (the bridge density can be improved, compared with when independent cationic photopolymerization is employed). However, when the cationic photopolymerization initiator and a reducing agent are to be employed together, the reducing agent must be selected so that the resultant initiator is a so-called redox initiator that does not react at normal temperature, but reacts at a specific temperature or higher (preferably, 60° C. or higher). Such a reducing agent is a copper compound, and copper triflate (trifluoromethane copper (II) sulfonate), especially, is the optimal agent, when the reactivity and the solubility of the epoxy resin are taken into account. A reducing agent, such as ascorbate, is also effective. When a higher bridge density (a high Tg) is required due to an increase in the number of nozzles (for high-speed printing) or the use of a non-neutral ink (an improvement in the water-proofing of a coloring agent), as will be described later, the above described reducing agent is employed as a solution after the coating resin layer has been developed, and the coating resin layer need only be immersed and heated at the postprocess step. In this manner, the bridge density can be increased.

An addition agent can be added, as needed, to the photocurable composite. For example, a flexibility-providing agent may be added to reduce the coefficient of the elasticity of an epoxy resin, or a silane coupling agent may be added to obtain a greater bonding force with a substrate.

The inhibitor of cationic photopolymerization is also added to the photocurable composite. The inhibitor of cationic photopolymerization adjusts the curing of a photocurable composite to inhibit the formation of a cured layer by light that reaches the unexposed portion that is used as a discharge port, at the interface between the positive type resist layer (solid layer) and the negative type resist layer (nozzle formation material layer) that was previously described. An arbitrary inhibitor of cationic photopolymerization can be employed so long as a desired curing characteristic at the light irradiation portion and scum occurrence prevention effects are obtained, and so long as the function of an acid catalyst can be degraded. Generally, a basic material is employed as an inhibitor of cationic photopolymerization, and a compound that can be used as an acceptor for protons, i.e., a basic material having a pair of nonshared electrons is appropriate. A nitrogen-containing compound having a pair of nonshared electrons is a compound that acts as a base relative to acid and that can effectively prevent the occurrence of scum. A specific nitrogen-containing compound is a compound containing nitrogen atoms, sulfur atoms or phosphorus atoms, and a typical example is an amine compound. Specifically, such amine compounds are: an amine, such as diethanolamine, triethanolamine or triisopropanolamine, replaced by a hydroxyalkyl having a carbon number of one or greater to four or smaller; a pyrimidine compound, such as pyrimidine, 2-aminopyrimidine or 4-aminopyrimidine; a pyridine compound, such as pyridine or methyl pryridine; and aminophenol, such as 2-aminophenol or 3-amonophenol The content of a basic material is preferably 0.01 to 100 weight % relative to the cationic photopolymerization initiator, and more preferably 0.1 to 20 weight %. Two or more types of basic materials may be employed together.

The negative type resist layer is exposed through a mask that blocks a portion that is to be used as a discharge port, and the portion other than the blocked portion (the non-exposed portion) is cured. Then, the negative type resist layer is developed by using a development liquid (a developer) to remove the non-exposed portion, and the discharge port is formed. Any type of general-purpose exposure apparatus may be employed for this pattern exposure; however, it is preferable that an exposure apparatus irradiate light in a wavelength area that matches the absorbed wavelength area of the negative type resist layer and that does not overlap the absorbed wavelength area of the positive type resist layer. It is also preferable that an aromatic solvent, such as xylene, be employed to develop the negative type resist layer after the pattern exposure has been performed.

The preferred embodiments of the present invention will now be described in detail while referring to the accompanying drawings (First Embodiment)

FIGS. IA to IE are schematic cross-sectional views showing the processing for a method according to a first embodiment of this invention for manufacturing a liquid discharge head. The method for manufacturing a liquid discharge head according to this embodiment will now be explained while referring to FIGS. IA to IE.

In FIG. IA, heat generation devices 2, which are liquid discharge energy generating elements, transistors, which independently drive the heat generation devices, and a circuit (not shown), which processes a data signal, for example, are mounted on a silicon substrate 1, and are electrically connected by wiring. A nitride film 5 is used as a mask for forming an ink supply port 9 that will be described later.

Figure 2:
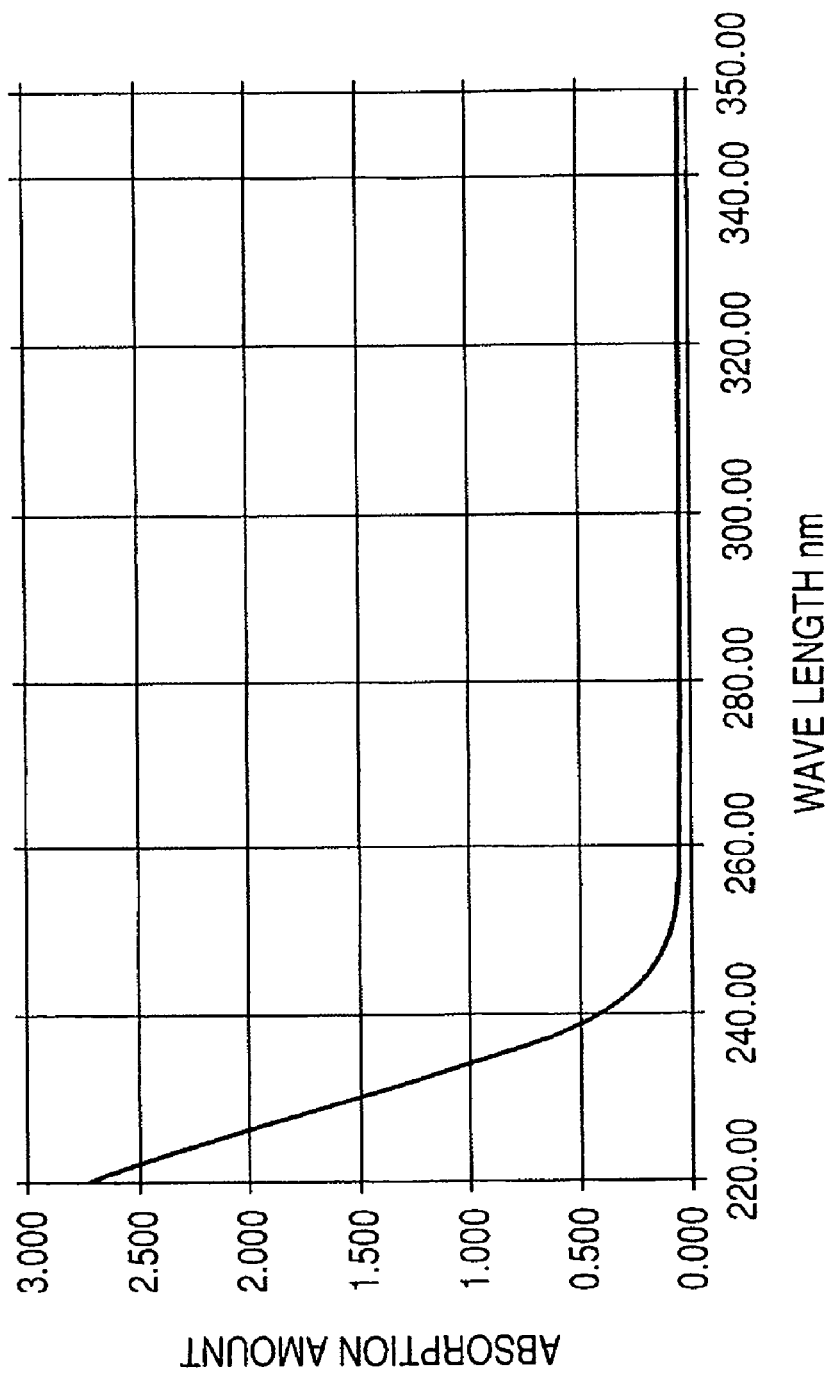
FIG. 2 is a diagram showing an absorption spectrum for P(PMMA-MAA) used for the invention.

Then, as shown in FIG. IB, a positive resist layer 3 is coated on the silicon substrate 1 as a dissolvable and removable solid layer, and baked. A general solvent coating method, such as spin coating or bar coating, can be employed for the coating of this layer. A positive type resist composite that contains the above-described copolymer of methacrylic acid and methyl methacrylate as resin elements is employed as a solid layer formation material. The baking temperature is 120 to 150° C., and the baking period is three to ten minutes. The thickness of the film is 10 to 20 µm Next, a shortwave ultraviolet (hereinafter referred to as Deep UV) irradiation apparatus (not shown) is employed to irradiate the positive type resist through a mask (not shown) using light having a wavelength of 200 to 300 nm. At this time, as shown in FIG. 2, since the absorbed wavelength area of the positive type resist is 200 to 250 nm, the decomposition reaction at the light irradiated portion is accelerated by the wavelength of the irradiating light (the energy distribution). Then, the positive type resist layer 3 is developed. A development liquid can be a liquid mixture of diethylene glycol, morpholine, monoethanolamine and pure water. Through the development process, a predetermined mold pattern, corresponding to flow paths, can be obtained.

Sequentially, a negative type resist layer 4, used as a discharge port formation material, is coated to cover the positive type resist layer 3. A common solvent coating method, such as spin coating, can be employed for this coating.

Resin composite 1 having the following composition is employed as a negative type resist composite that is a discharge port formation material (a film thickness of 10 µm on the positive type resist layer 3: see FIG. IB). For the formation of the negative type resist composite, the resin composite 1 is dissolved in a solvent mixture of methyl isobutyl ketone and xylene at a density of 60 mass %, and the resultant composite is used for spin coating.

Resin Composite 1:
Epoxy resin (EHPE-3158 by Daicel Chemical Industries, Ltd.): 100 parts by weight
Silane coupling agent (A-187 by Nippon Unicar Co., Ltd.): 1 part by weight
Cationic photopolymerization initiator (SP-170 by Asahi Denka Kogyo K.K.): 1.5 parts by weight
Inhibitor of cationic photopolymerization (triethanolamine): 13 mol % relative to SP-170

Figure 1A:
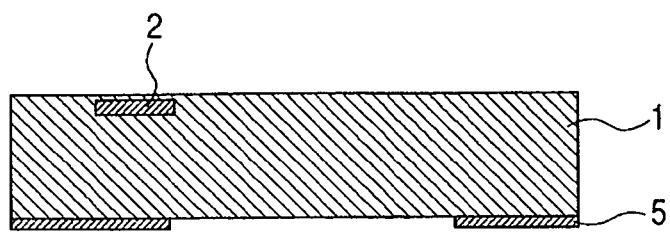
FIGS. 1A, 1B, 1C, 1D and 1E are diagrams showing the processing for forming ink flow paths according to a first embodiment of the present invention.
Figure 1B:
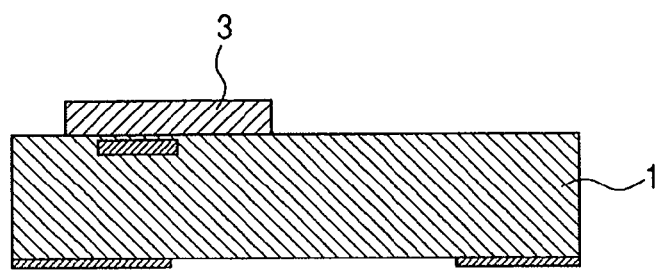
Figure 1C:
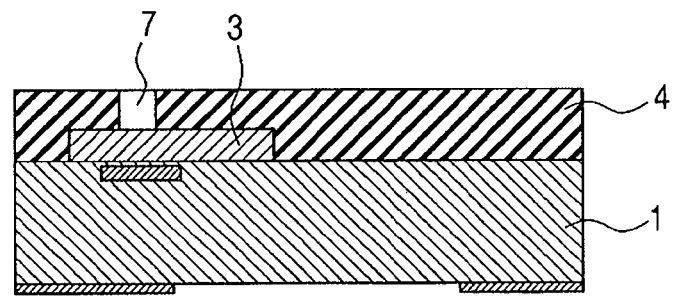
Figure 1D:
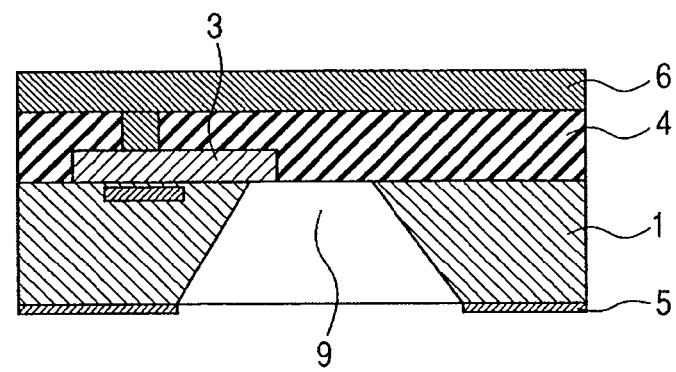
Figure 3:
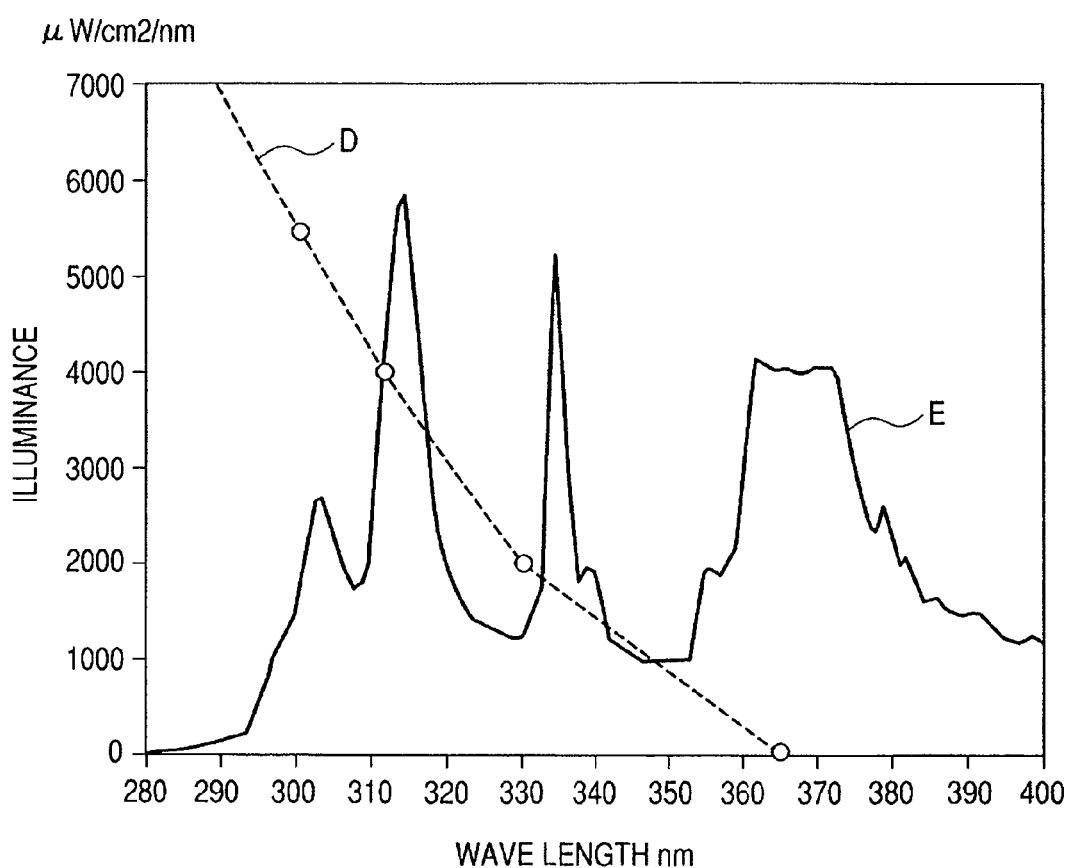
FIG. 3 is a diagram showing an absorption spectrum for resin composite 1, which is used for the invention.

An arbitrary general exposure apparatus can be employed for this pattern exposure process. However, as shown in FIG. 3, it is preferable that an exposure apparatus (E) irradiate light having a wavelength area that matches the absorbed wavelength area (indicated by a broken line (D) in FIG. 3) of the negative type resist layer (the negative type coated resin 1) and that does not match the absorbed wavelength area (200 to 250 nm in this embodiment) of the positive type resist layer 3. It is also preferable that an aromatic solvent, such as xylene, be employed for the development of the negative type resist layer 4 after the exposure pattern has been completed. The state wherein a discharge port 7, which reaches the positive type resist layer 3, is formed in the cured layer 4 of the negative type resist layer is shown in FIG. 1C.

Figure 1E:
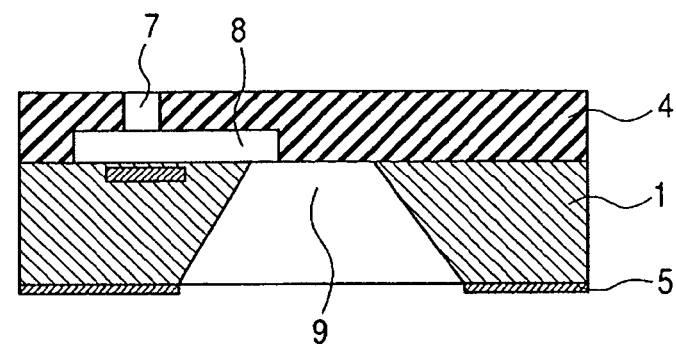

Following this, in order to obtain a structure shown in FIG. ID, one side of the substrate 1 is protected with a resin 6 that coats the face whereat the discharge port 7 is formed, and by anisotropic etching, an ink supply port 9 is formed from the reverse face of the silicon substrate 1 using an alkaline solution, such as TMAH (tetramethylammonium hydride). Thereafter, the resin 6 is dissolved and removed, and an ionizing radiation of 300 nm or lower is collectively projected across the cured layer 4 of the negative type resist layer. The purpose of this radiation is the decomposition of the copolymer, which consists of the positive type resist layer 3, and the reduction of the molecular weight, so that the resin 6 can be easily removed. Finally, the positive type resist layer 3, used for the mold, is removed using a solvent, and the state shown in FIG. 1E is obtained. As a result, an ink channel, extending from the ink supply port 9, along the flow path 8, to the discharge port 7, is formed.

Since the above-described method employs a solvent coating method, such as spin coating, used for a semiconductor manufacturing technique, ink flow paths can be formed for which the heights are extremely accurate and stable. In addition, since the photolithography technique for semiconductors is employed for the two-dimensional shape parallel to the substrate, accuracy at a sub-micron level can be attained. Furthermore, since a radical polymerization inhibitor is mixed with the negative type resist composite, and since a copolymer of methacrylic acid and methacrylate ester, which has a high polarity, is employed for the positive type resist layer, the formation of a compatible layer is restricted at the interface with the negative type resist layer that is overlaid. Thus, the occurrence of scum at the interface described above is prevented, (Second Embodiment)

FIGS. 4A to 4F are cross-sectional views for explaining example solid layer formation processing that can be employed for the present invention. A second embodiment of this invention differs from the first embodiment in that a laminated structure, for which a plurality of materials are used, is employed for the solid layer.

First, the solid layer formation processing that can be employed for this invention will be described while referring to FIGS. 4A to 4F.

Figure 4A:
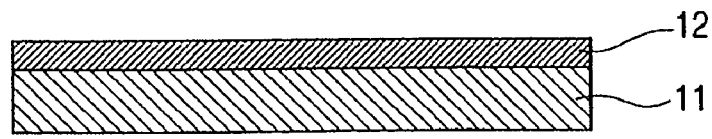
FIGS. 4A, 4B, 4C, 4D, 4E and 4F are diagrams for explaining example processing for forming a solid layer applicable for the present invention.
Figure 4B:
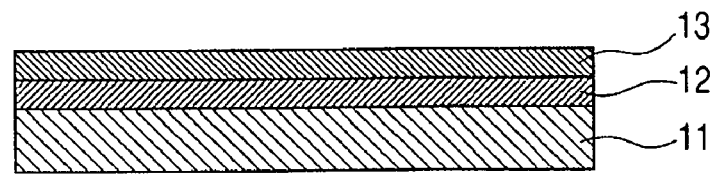
Figure 4C:
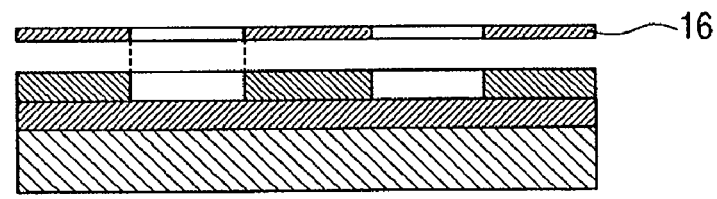

As shown in FIG. 4A, a positive type resist layer 12 that contains polymethylisopropenylketone (PMIPK) as a resin element is deposited on a substrate 11. Specifically, an ODUR positive type resist is applied by spin coating, and is prebaked at 120° C. for three minutes. Then, the structure is baked at 150° C. for 30 minutes. The film thickness at this time is 15 µm. Thereafter, in order to prevent the outer edge of a wafer from being raised, Deep UV light is projected through a wafer outer edge exposure mask (not shown) onto only the outer edge of the wafer using UX-3000SC, by Ushio Inc., and the positive type resist raised at the outer edge of the wafer is developed and removed. Sequentially, as shown in FIG. 4B, a positive type resist layer 13 that contains a copolymer (P(MMA-MAA)) of methacrylic acid and methyl methacrylate as a resin element is deposited on the ODUR positive type resist layer 12 using spin coating. During this process, the same positive type resist composite is employed as is used for the first embodiment. The film thickness is 5 µm Following this, as shown in FIG. 4C, the positive type resist layer 13 is exposed, while a photomask 16, with which exposed portions are to be removed, is employed for the positive type resist layer 13. At this time, when an area of 230 to 260 nm is designated as the exposure wavelength area, the lower positive type resist layer, is nearly not exposed to light. This is because absorption of ketone is due to a carbonyl group, and almost all the light in the 230 to 260 nm area is transmitted through.

The exposed positive type resist layer 13 is developed using an alkaline liquid mixture of diethylene glycol, morpholine, monoethanolamine and pure water, and a predetermined pattern is obtained. With this alkaline development liquid, the speed of dissolution of the acrylic resist of the non-exposed portion can be greatly reduced, and the affect on the lower layer, during the development of the upper layer, less significant.

Figure 4D:
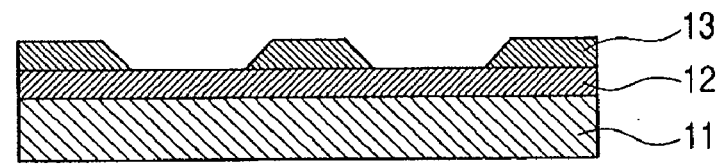
Figure 4E:
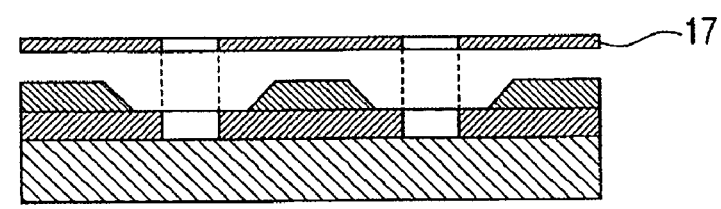

Next, as shown in FIG. 4D, post-baking is performed for the entire substrate at 130° C. for three minutes, so that side walls, tilted at about 10°, can be formed on the upper positive type resist layer 13. Thereafter, as shown in FIG. 4E, the positive type resist layer 12 is exposed, while a photomask 17, with which exposed portions are to be removed, is employed for the positive type resist layer 12. At this time, when the wavelength of 270 to 330 rim has been designated as the exposure wavelength, the lower positive type resist layer 12 can be exposed. Since the exposure wavelength of 270 to 330 nm is transmitted through the upper, positive type resist layer, almost no affect is produced by light entering through the mask or light reflected at the substrate.

Figure 4F:
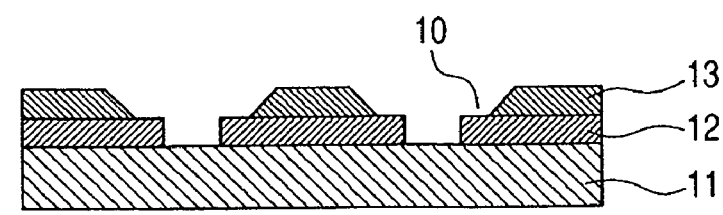

Finally, as shown in FIG. 4F, the exposed, lower positive type resist layer 12 is developed, and a predetermined pattern wherein the lower layer and the upper layer are laminated like steps is obtained. In this lamination structure, the lower face of the upper layer is positioned within the upper face of the lower layer, and one part 10 of the upper face of the lower layer is exposed. Methyl isobutyl ketone, which is an organic solvent, is appropriate for the development liquid. Since the non-exposed P(MMA-MAA) is nearly not dissolved by this liquid, the upper layer pattern is not changed during the development of the lower resist layer.

While referring to FIGS. 5A to 5H, an explanation will now be given for a liquid discharge head manufacturing method according to this embodiment that employs the solid layer shown in FIGS. 4A to 4F. FIGS. 5A to 5H are cross-sectional views of the ink flow path forming processing according to the second embodiment.

Figure 5A:
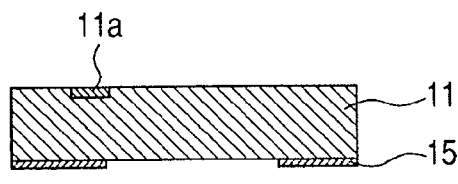
FIGS. 5A, 5B, 5C, 5D, 5E, SF, 5G and 5H are diagrams showing the processing for forming ink flow paths according to a second embodiment of the present invention.

Since a driver and a logic circuit, for controlling a discharge energy generation device 11a, are produced by a general semiconductor manufacturing method, it is appropriate that, as shown in FIG. 5A, silicon be used for a substrate 11. Further, a YAG laser or a technique such as sand blasting may be employed to form ink supply through holes in a silicon substrate. However, it is preferable that the through holes are not present when the resist is coated, and as such a method, the silicon anisotropic etching technique using an alkaline solution can be employed. In this case, a mask pattern 15 of, for example, alkali-resisting silicon nitride need only be formed on the reverse face of the substrate, and a membrane film (not shown) of the same material need only be formed as an etching stopper on the obverse face of the substrate.

Figure 5B:
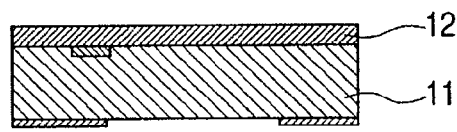
Figure 5C:
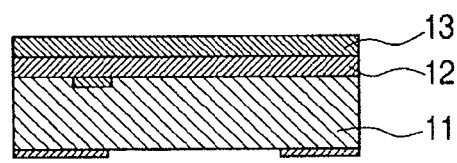
Figure 5D:
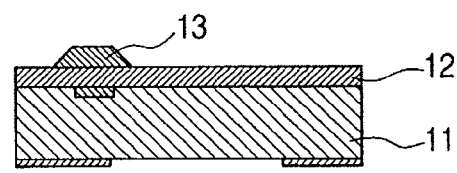

Sequentially, as shown in FIG. 5B, a positive type resist layer (ODUR layer) 12 containing PMIPK is deposited on the substrate 11. This deposition can be performed using common spin coating. The film thickness is 15 µm Then, as shown in FIG. 5C, a positive type resist layer (P(MMA-MAA) layer) 13 of 5 µm thick is formed on the ODUR layer 12 using spin coating. Following this, the P(MMA-MAA) layer 13 is exposed to obtain a structure shown in FIG. 5D. As previously described, a photomask with which the exposed portions are to be removed is employed for the P (MMA-MAA) layer 13. At this time, when the wavelength area of 230 to 260 run is designated as the exposure wavelength area, the lower positive type resist layer 12 is almost not exposed. This is because the absorption of ketone is due to a carbonyl group, and light of 230 to 260 nm is almost all transmitted through. The exposed P(MMA-MAA) layer 13 is developed by an alkaline liquid mixture of diethylene glycol, morpholine, monoethanolamine and pure water, and a predetermined pattern is obtained. With this development liquid, the dissolving speed of the acrylic resist of the rion-exposed portion can be lowered greatly, and the affect on the lower layer during the development of the upper layer less significant.

Figure 5E:
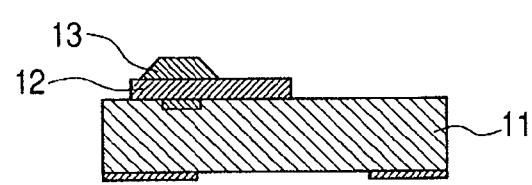

Next, to obtain a structure shown in FIG. 5E, the ODUR layer 12 is exposed, while a photomask with which exposed portions are to be removed is employed for the ODUR layer 12. At this time, when the wavelength of 270 to 330 nm is designated as the exposure wavelength, the lower positive type resist layer can be exposed. Further, since the exposure wavelength of 270 to 330 nm is transmitted through the upper positive type resist layer 13, there is almost no affect incurred by light entering from the mask or light reflected from the substrate. Thereafter, the lower positive resist layer 12 is developed, and a predetermined pattern is obtained. Methyl isobutyl ketone, which is an organic solvent, is appropriate for the development liquid. Since the non-exposed P (MMA-MAA) is nearly not dissolved by this liquid, the pattern of the upper layer 13 is not changed during the development of the lower resist pattern 12.

Figure 5F:
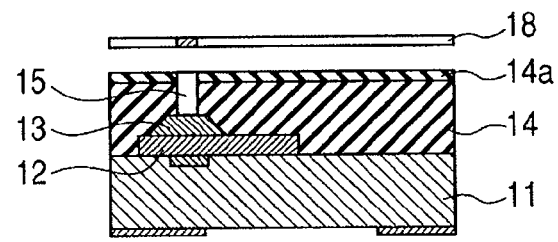

Following this, as shown in FIG. 5F, a curable composite is coated as a nozzle formation material to cover the lower ODUR layer 12 and the upper P(MMA-MAA) layer 13, and is used as a coated resin layer 14. A common solvent coating method, such as spin coating, can be employed as a coating method.

Figure 5G:
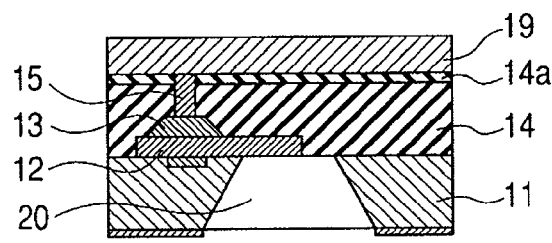
Figure 5H:
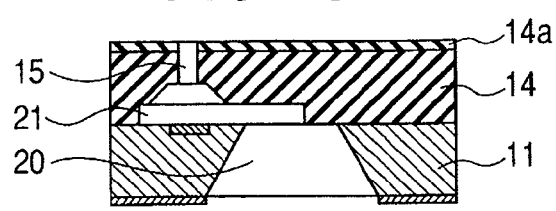

Resin composite 1 used in the first embodiment of this invention is dissolved in a solvent mixture of methyl isobutyl ketone and xylene at a density of 60 mass %, and the resultant mixture is applied using spin coating. The thickness of the obtained film on the substrate 11 is 25 µm. Then, pattern exposure for formation of ink discharge ports is performed by MPA-600FA, by Canon Inc. It should be noted that exposure is performed using 2.5 J/cm$^2$ and PEB is performed at 90° C. for four minutes. Sequentially, a development process is performed using methyl isobutyl ketone/xylene to form ink discharge ports. In this embodiment, a discharge port pattern of φ8 µm is formed. When a repellent film is to be deposited on the discharge port formation material, as described in Japanese Patent Application Laid-Open No. 2000-326515, a photosensitive repellent layer 14a need only be deposited and be collectively exposed and developed. At this time, the photosensitive repellent layer 1.4a can be deposited by laminating, spin coating, slit coating or spraying. Thereafter, the nozzle formation material 14 and the photosensitive repellent layer 14a are exposed at the same time. Since generally nozzle formation material 14 having a negative type characteristic is used, a photomask 18 is employed that prevents a discharge port portion from being exposed to light. And the layer of the discharge port formation material 14 is developed and a discharge port 15 is formed. It is preferable that an aromatic solvent, such as xylene, be employed for development. Next, as shown in FIG. 5G, by using OBC, marketed by Tokyo Ohka Kogyo Co., Ltd., a cyclized isoprene 19 is coated on the discharge port formation material layer in order to protect this material layer from an alkaline solution. Thereafter, the silicon substrate 11 is immersed in a tetramethylammonium hydride solution (TMAH) having a 22 mass % at 83° C. for 13 hours, and a through hole 20 for ink supply is formed in the silicon substrate 11. Further, silicon nitride 15, which is used as a mask and as a membrane to form an ink supply hole, is patterned in advance in the silicon substrate 11. Sequentially, after the anisotropic etching has been performed, the silicon substrate is mounted on a dry etching apparatus with the reverse face on top, and the membrane film is removed by an etchant wherein oxygen at 5% is mixed with $CF_4$. Then, the silicon substrate 11 is immersed in xylene to remove OBC.

Therefore, by exposing the overall structure, the positive type resist layer (ODUR layer and the P(MMA-MAA) layer), which is the mold for flow paths is decomposed. When light having a wavelength of 330 nm or lower is projected, the resist materials of the upper and lower layers are decomposed into low-molecular compounds, and easily removed by a solvent. Finally, the positive type resist layer, which is the mold for flow paths is removed by a solvent. Through this processing, a flow path 21 communicating with the discharge port 15 is formed, as shown in the cross section in FIG. 5H. The flow path 21 in this invention is one part of a flow path pattern, and is so shaped that the height of the flow path 21 is low near a discharge chamber, which is a bubble generation chamber that contacts a heater 11a (liquid discharge energy generation section) 11a. When ultrasonic or megasonic vibration is applied at the step of removing the mold using a solvent, the dissolving and removal period can be reduced.

The thus obtained ink jet recording head was mounted to a recording apparatus, and recording was performed using ink consisting in the pure state of diethylene glycol/isopropyl alcohol/isopropyl alcohol/lithium acetate/black dye food black 2=79.4/15/3/0.1/2.5. Compared with the conventional structure (the lower layer: P(MMA-MAA), the upper layer: PMIPK, no reaction inhibition material), the amount of ink discharged in this embodiment was increased by about 20%, stable printing was performed, and high quality printed matter was obtained. When the ink jet recording head for this embodiment was disassembled, scum could not be found through observation by the SEM, while in the conventional example, scum of several µm was observed along the flow paths.

As is described above, according to this embodiment, the above described shortcomings can be solved by the ink jet recording head manufacturing method that, at the least, comprises the steps of: coating and patterning, on a substrate including ink discharge means, two removable resin layers used to form ink flow paths; coating and patterning a discharge port formation material used to form ink flow paths and ink discharge ports; removing the removable resin; and using an ink jet recording head for which the nozzle formation material, at the least, contains a cationically polymerizable chemical compound, a cationic photopolymerization initiator and an inhibitor of cationic photopolymerization.

Specifically, the cationic photopolymerization initiator generates cations upon irradiation with light, and the cations produce ring-opening polymerization of the epoxy ring of the epoxy resin, so that curing occurs based on the cationic addition polymerization reaction. However, when an inhibitor of cationic photopolymerization, such as a nitrogen-containing compound, is present, this inhibitor forms a strong ion pair with generated cations, and in this case, the ring-opening polymerization of the epoxy ring is halted. Thus, when the inhibitor of cationic photopolymerization is appropriately mixed, a curing speed for the exposed portion can be arbitrarily controlled, and a desired cured state can be precisely obtained. Furthermore, at the interface between the exposed portion and the non-exposed portion, the curing condition is suppressed or is insufficient, depending on the amount of light that has reached the interface, or the amount of cations that are generated at the interface, or are dispersed from the exposed portion, and the occurrence of a compatible layer is also suppressed. Therefore, the occurrence of the scum described above can be prevented.

(Third Embodiment)

Figure 6A:
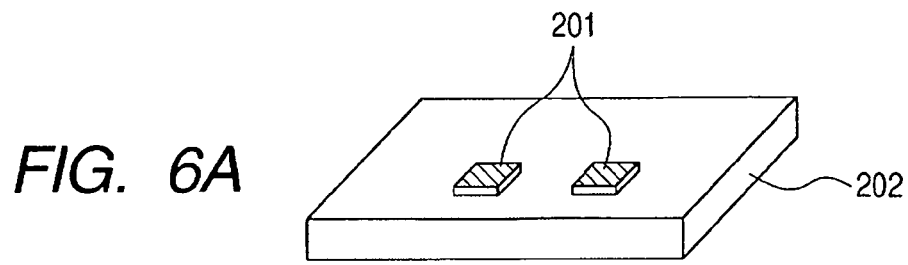
FIGS. 6A, 6B, 6C, 6D, 6D, 6F and 6G are diagrams showing the processing for forming ink flow paths according to a third embodiment of the present invention.

FIGS. 6A to 6G are diagrams showing the structure of a liquid ejection recording head and the manufacturing processing according to a third embodiment of the invention. In this embodiment, a liquid ejection recording head having two orifices (discharge ports) is shown. However, the same processing is performed for a high-density multi-array liquid ejection recording head having more orifices. In the third embodiment, a substrate 202 is employed that is made, for example, of glass, ceramics, plastic or metal, as shown in FIG. 6A. FIG. 6A is a schematic perspective view of a substrate before a photosensitive material layer is formed.

So long as the substrate 202 functions as a part of a wall member for a flow path, and as a support member for a flow path structure made of a photosensitive material layer that will be described later, the shape and the material of the substrate 202 are not especially limited. A desired number of liquid discharge energy generation devices (liquid discharge energy generating elements) 201, such as electro-thermal conversion devices or piezoelectric devices, are arranged on the substrate 202 (two in FIG. 6A). The array density is a pitch of 600 dpi or 1200 dpi. Discharge energy for discharging small liquid droplets is applied to ink by the liquid discharge energy generation devices 201, and recording is performed. When electro-thermal conversion devices are employed as the liquid discharge energy generation devices 201, these devices heat the nearby recording liquid and generate and discharge energy. Or, when piezoelectric devices are employed, discharge energy is generated by the mechanical vibration of these devices. It should be noted that control signal input electrodes (not shown) for driving these devices are connected to the devices 201. Further, generally, various function layers, such as a protective layer, are formed in order to extend the life expectancy of these discharge energy generation devices 201, and also in this invention, these function layers can be provided naturally.

Most commonly, silicon is employed for the substrate 202. That is, since a driver and a logic circuit that controls discharge energy generation devices are produced using a common semiconductor manufacturing method, it is appropriate for silicon to be employed for the substrate. Further, a YAG laser or a sandblasting technique can be employed for forming ink supply through holes in the silicon substrate. However, when a heat-bridge type resist is employed as a lower layer material, the pre-bake temperature for the resist is extremely high, as described above, and greatly exceeds a glass transition temperature for a resin, and during prebaking, the resin coated film hangs down into the through hole. Therefore, it is preferable that through holes not be formed during the resist coating process. For this method, the silicon anisotropic etching technique using an alkaline solution can be employed. In this case, a mask pattern made, for example, of alkaline-resisting silicon nitride must only be formed on the reverse face of the substrate, and a membrane film of the same material must be formed on the obverse face as an etching stopper.

Figure 6B:
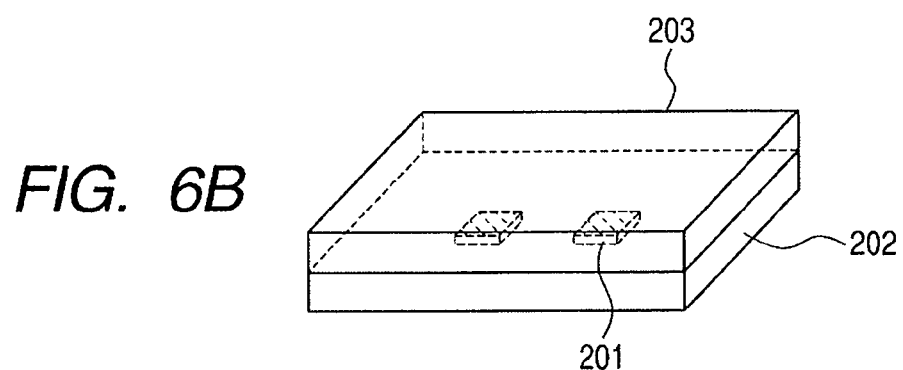
Figure 6C:
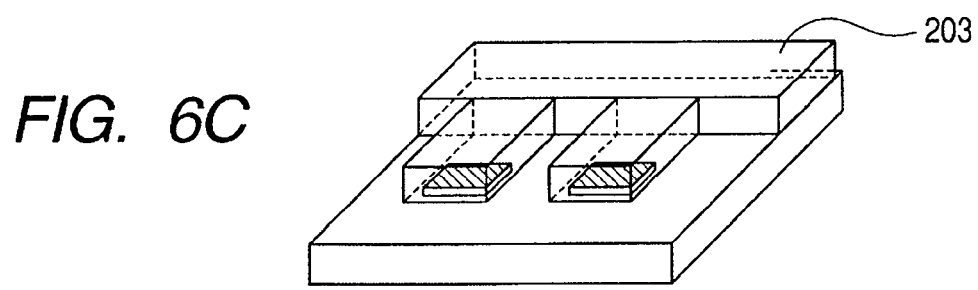
Figure 7:
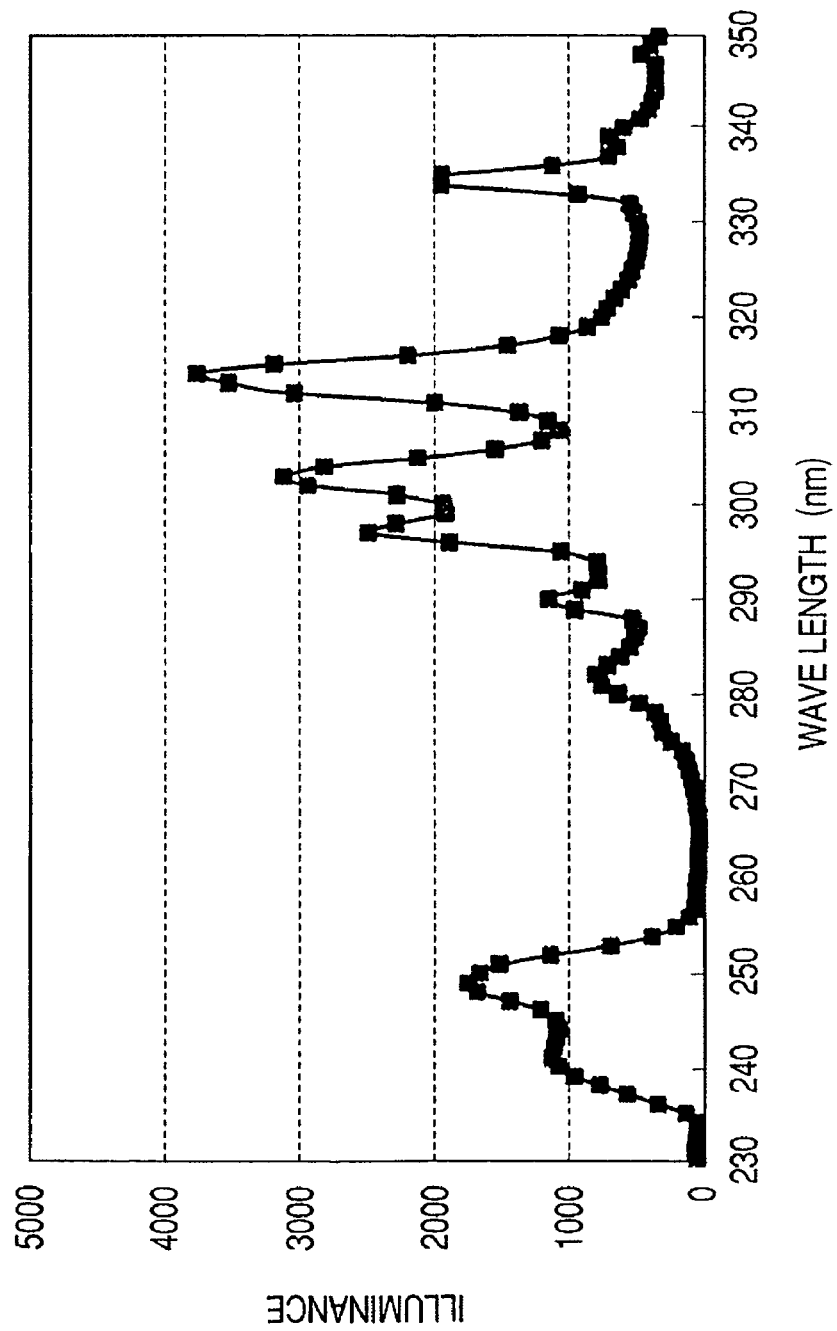
FIG. 7 is a diagram for explaining a correlation between the wavelength of an exposure apparatus and the illuminance thereof used for a liquid discharge head manufacturing method according to the present invention.

Following this, as shown in FIG. 6B, a positive type resist layer 203 is formed on the substrate 202 including the liquid discharge energy generation devices 201. This material is a copolymer of methyl methacrylate and methacrylic acid at a ratio of 90:10, and the weight-average molecular weight (Mw) is 100000, while the degree of dispersion (Mw/Mn) is 2.00. The absorption spectrum for P(MMA-MAA), which is a positive type resist material for forming a mold, is shown in FIG. 2. As is shown in FIG. 2, since the absorption spectrum for the positive type resist material is present in the area for 250 nm or lower, even when radiated by a wavelength of 260 nm or higher, the molecules of the materials are not excited in the pertinent energy area, and accordingly, a decomposition reaction is not accelerated. That is, the decomposition reaction of the positive type resist material is accelerated only by an ionizing radiation of 250 nm or lower, and at the succeeding development step, pattern formation can be performed. The particles of this resin are dissolved in diglyme at a solid content density of about 30 WT %, and the resultant liquid is used as a resist liquid. The viscosity of the coating solution at this time is about 600 cps. The resist liquid is applied to the substrate using spin coating, and the whole substrate is prebaked at 120° C. for three minutes and is then primarily cured in an oven at 150° C. for six minutes. The thickness of the thus obtained film is 15 μm Following this, as shown in FIG. 6c, patterning (exposure and development) of the positive type resist layer is performed. The exposure process is performed with a first wavelength of 210 to 330 nm, shown in FIG. 7. Although light of 260 nm or higher is irradiated, this light does not contribute to the decomposition reaction of the positive type resist layer. It is most appropriate to use a cut filter that blocks light of 260 nm or higher. During the exposure process, the positive resist layer is exposed to ionizing radiation through a photomask on which a desired pattern is drawn. When an exposure apparatus including a projective optical system that has no affect on diffracted light is employed, mask design while taking convergence into account is not required.

Figure 6D:
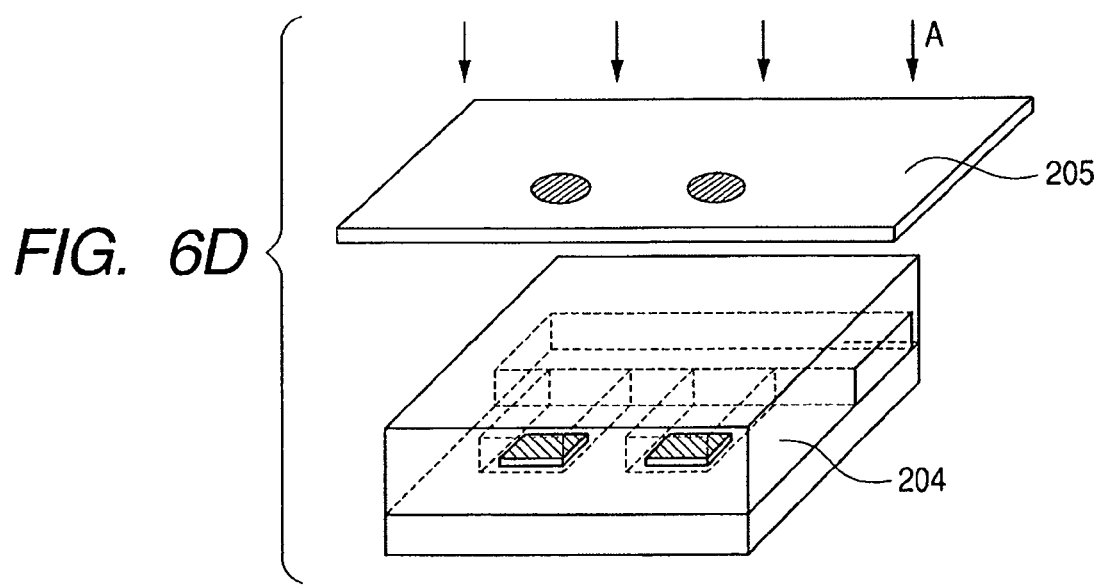

Sequentially, as shown in FIG. 6D, a resin composite used in the first embodiment is employed to deposit a discharge port formation layer 204 used to form nozzles, so that the patterned positive type resist layer is covered.

The coating process is performed using spin coating, and the prebaking process is performed using a hot plate at 90° C. for three minutes.

Following this, as shown in FIG. 6D, pattern exposure and development of an ink discharge port are performed for the discharge port formation layer 204 using a mask 205. An arbitrary exposure apparatus can be employed so long as it can irradiate general UV light, and there is no restriction on the upper limit of the wavelength area of irradiated light A so long as the wavelength area is 290 nm or higher and the negative type coated resin can react to the light During the exposure process, a mask is employed that prevents radiation of light from a portion that is to be an ink discharge port. The exposure is performed using Mask aligner MPA-600 Super, by Canon Inc., with 1000 mJ/cm$^2$, As shown in FIG. 3, the above described exposure apparatus (E) radiates UV light of 290 to 400 nm, and within this area, the negative type coated resin has a photosensitive characteristic. When this exposure apparatus is employed, as shown in FIG. 6D, the pattern for the positive type resist layer formed in FIG. 6B is also exposed, through the negative type coated resin, to the UV light of 290 to 400 nm. Therefore, since the positive type resist material used in this invention reacts only to DeepUV light of 250 nm or lower, the decomposition reaction of the material is not accelerated at this step.

Figure 6E:
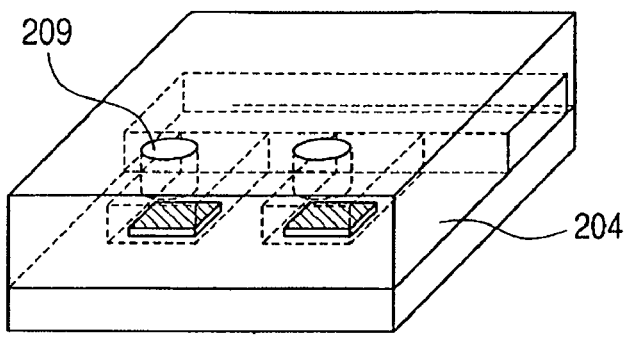

Thereafter, as shown in FIG. 6E, for development, the entire substrate is immersed in xylene for sixty seconds, and is then baked, at 100° C., for one hour to increase the adhesion between the materials in the flow path structure. Sequentially, although not shown, a cyclized isoprene is coated on the flow path structure material layer to protect the material layer from an alkaline solution. For this material, OBC marketed by Tokyo Ohka Kogyo Co., Ltd. is employed. Then, the silicon substrate is immersed in a tetramethylammonium hydride (TMAH) solution of 22 mass % at 83° C. for 14.5 hours, and through holes (not shown) for ink supply are formed. Further, silicon nitride, used as a mask and a membrane for forming ink supply holes, is patterned in advance in the silicon substrate. After this anisotropic etching has been completed, the silicon substrate is mounted on a dry etching apparatus with the reverse face on top, and the membrane film is removed by an etchant wherein oxygen, 5%, is mixed with $CF_4$. Then, the silicon substrate is immersed in xylene to remove the OBC.

Figure 6F:
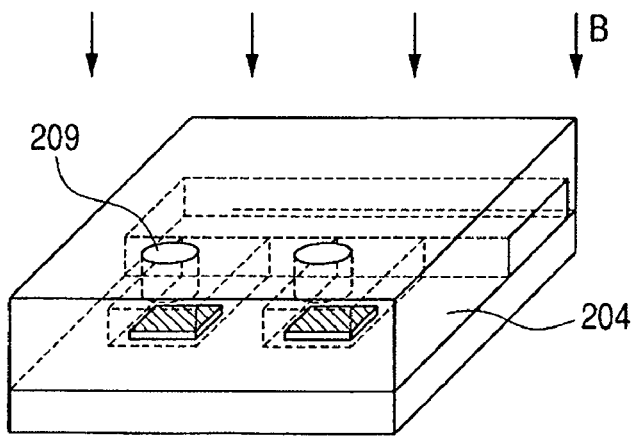
Figure 6G:
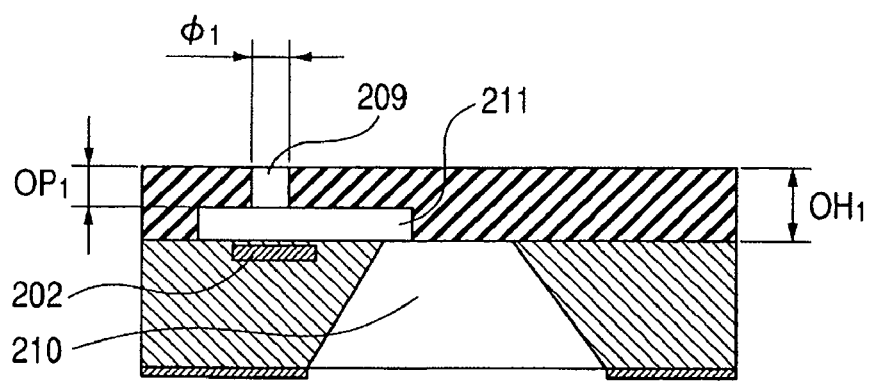

Next, as shown in FIG. 6F, by using a low pressure mercury lamp, ionizing radiation B within the wavelength area 210 to 330 nm is projected onto the entire flow path structure material 207, and the positive type resist is decomposed. Thereafter, the silicon substrate is immersed in methyl lactate to collectively remove the mold pattern made of the positive type resist, as shown in the vertical cross-sectional view in FIG. 6G. At this time, the silicon substrate is placed in a megasonic tub of 200 MHz in order to reduce the elution time. Through this process, an ink flow path 211 including a discharge port is formed, and thus, an ink discharge element is obtained wherein ink from an ink supply hole 210 is introduced to the ink flow path 211 and is discharged from a discharge port 209 by a heat generation device 202. The size of the obtained discharge port 209 is φ8 μm, the OH height is 20 μm, and the OP thickness is 5 μm. Further, there is no occurrence of the above-described scum.

Figure 8:
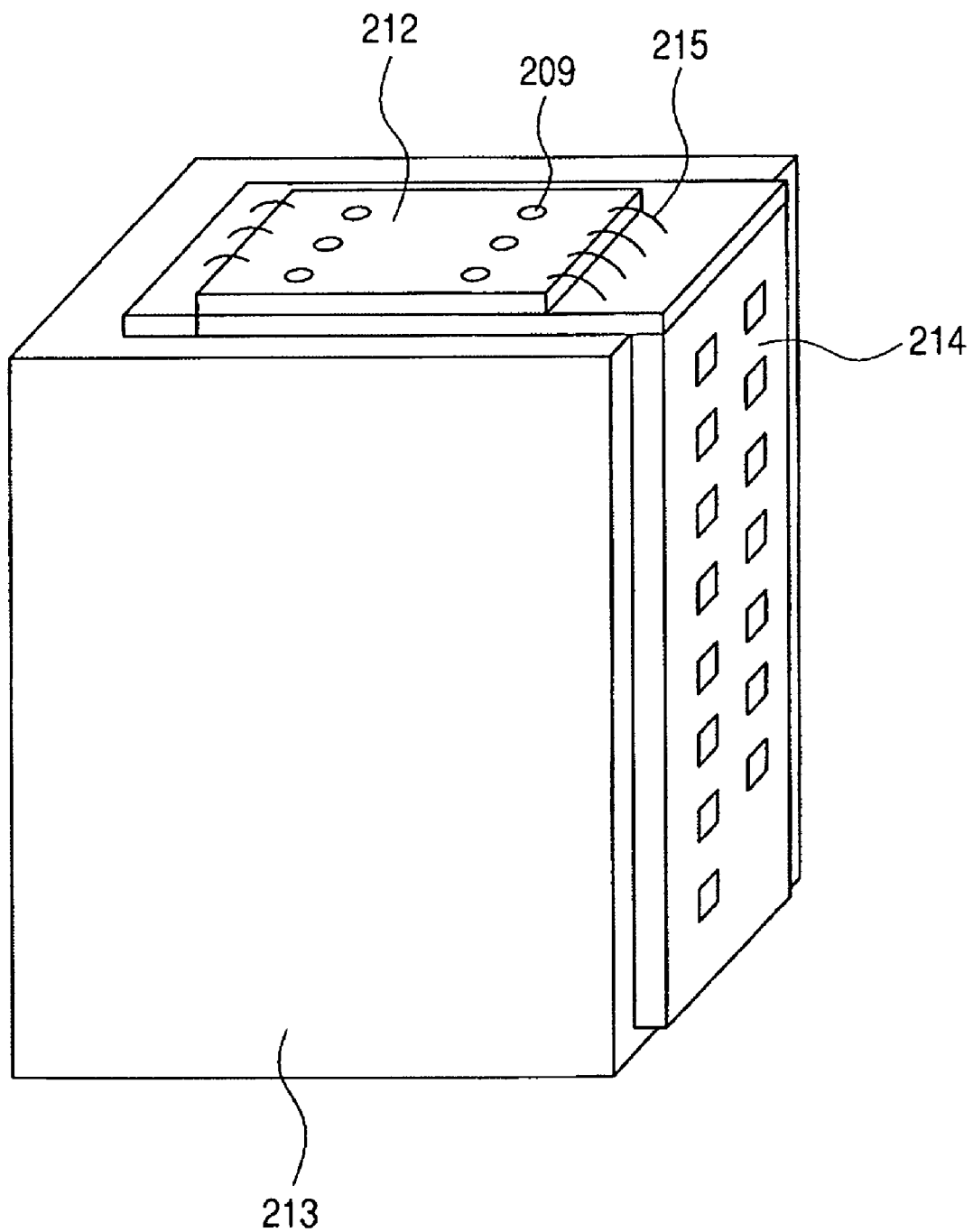
FIG. 8 is an explanatory diagram showing an ink jet head unit manufactured using the liquid discharge head manufacturing method of the present invention.

When the thus obtained discharge element was mounted on an ink jet head unit shown in FIG. 8, and a recording evaluation was performed, satisfactory-image recording was enabled. As one mode for this ink jet head unit, as shown in FIG. 8, for example, a TAB film 214 that exchanges record signals with the main body of a recording apparatus is provided on the outer face of a holding member that supports a detachable ink tank 213, and an ink discharge element 212 is mounted on the TAB film 214 and is connected to electrical wiring by electrical connection leads 215.

(Fourth Embodiment)

FIGS. 9A to 9I are diagrams showing the structure of a liquid ejection recording head according to a fourth embodiment of the present invention, and a manufacturing method therefor. In this embodiment, a liquid ejection recording head having two orifices (discharge ports) is shown; however, the same processing is applied for a high-density multi-array liquid ejection recording head having more than two orifices.

Figure 9A:
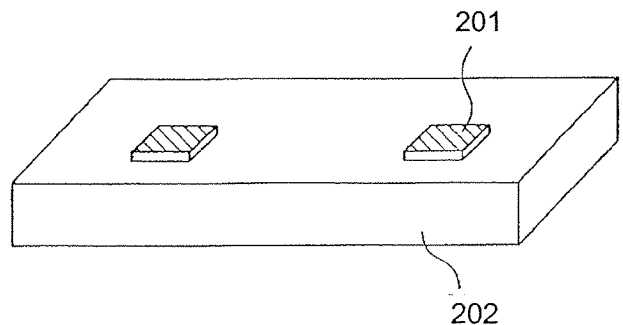

In the fourth embodiment, a substrate 202 is employed that is made, for example, of glass, ceramics, plastic or metal, as shown in FIG. 9A. FIG. 9A is a schematic perspective view of a substrate before a photosensitive material layer is formed. So long as the substrate 202 functions as a part of a wall member for a flow path, and as a support member for a flow path structure made of a photosensitive material layer that will be described later, the shape and the material of the substrate 202 are not especially limited. A desired number of liquid discharge energy generation devices (liquid discharge energy generating elements) 201, such as electro-thermal conversion devices or piezoelectric devices, are arranged on the Substrate 202 (two in FIG. 9A). Discharge energy for discharging small liquid droplets is applied to ink by the liquid discharge energy generation devices 201, and recording is performed. When electro-thermal conversion devices are employed as the liquid discharge energy generation devices 201, these devices heat the recording liquid nearby and generate discharge energy. Or, when piezoelectric devices are employed, discharge energy is generated by mechanical vibration of these devices.

It should be noted that control signal input electrodes (not shown) for driving these devices are connected to the discharge energy generation devices 201. Further, generally, various function layers, such as a protective layer, are formed in order to extend the life expectancy of these discharge energy generation devices 201, and also, naturally, in this invention, these function layers can be provided. Most commonly, silicon is employed for the substrate 202. That is, since a driver and a logic circuit that controls discharge energy generation devices are produced by a common semiconductor manufacturing method, it is appropriate for silicon to be employed for the substrate. Further, a YAG laser or a sandblasting technique can be employed for forming ink supply through holes in the silicon substrate. However, it is preferable that through holes not be formed during the resist coating process. For this method, the silicon anisotropic etching technique that uses an alkaline solution can be employed. In this case, a mask pattern made, for example, of alkaline-resisting silicon nitride must only be Rained on the reverse face of the substrate, and a membrane film of the same material must be formed on the obverse face as an etching stopper.

Figure 9B:
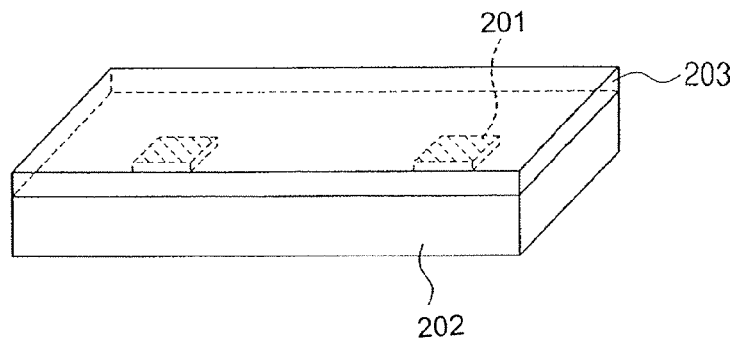

Sequentially, as shown in FIG. 9B, a PMIPK positive type resist layer 203 is coated on the substrate 202 on which the liquid discharge energy generation devices 201 are mounted. As PMIPK, the resin density of ODUR-1010 marketed by Tokyo Ohka Kogyo Co., Ltd., is adjusted to 20 WT%. The prebaking process is performed using a hot plate at 120° C. for three minutes, and thereafter, the thermal process is performed in an oven, under a nitrogen atmosphere, at 150° C. for 30 minutes. The thickness of the deposited film is 15 μm.

Figure 9C:
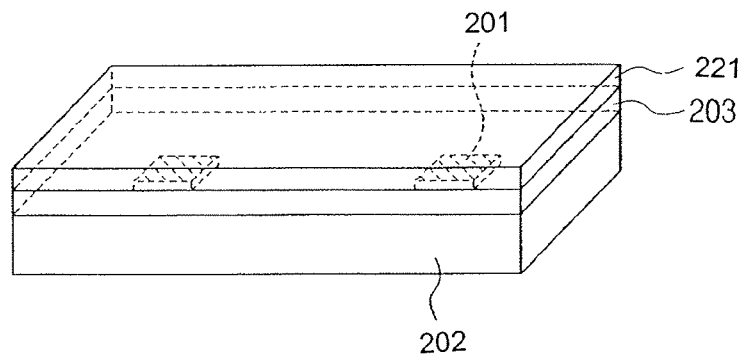

Following this, as shown in FIG. 9C, a photodegradable positive type resist layer 221 of P(MMA-MAA) is applied to the positive type resist layer 203. The following positive resist is employed for the photodegradable positive type resist of P(MMA-MAA):

radical polymer (P(MMA-MAA)) of methyl methacrylate and methacrylic acid, weight-average molecular weight (Mw: polystyrene conversion)=170000, degree of dispersion (Mw/Mn)=2.3.

The particles of this resin are dissolved in a diglyme solvent having a solid content density of about 25 mass %, and the resultant liquid is used as a resist liquid. The viscosity of the resist solution at this time is 600 cps. The resist liquid is applied to the substrate using spin coating, and the entire substrate is prebaked at 100° C. for three minutes, and is heated in an oven, under a nitrogen atmosphere, at 150° C. for 30 minutes. The thickness of the thus formed resist layer, after the heat processing, is 5 μm.

Figure 9D:
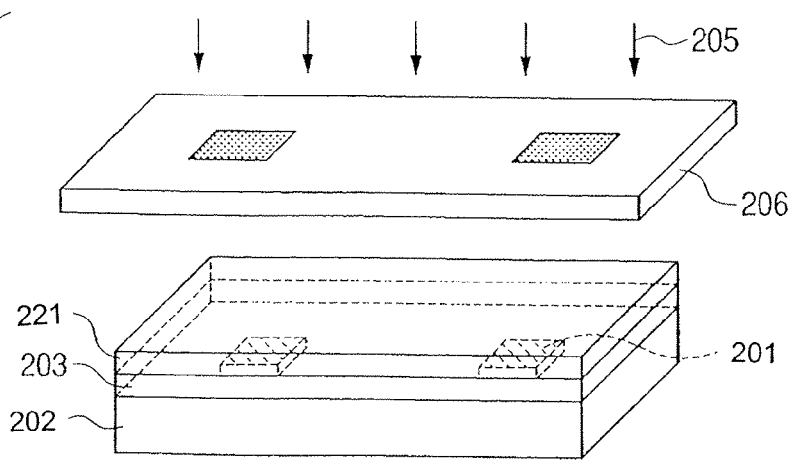

Next, as shown in FIG. 9D, exposure is performed for the photodegradable positive resist layer 221 of P(MMA-MAA). Mask aligner UX-3000 SC, by Ushio Inc., is employed as an exposure apparatus, and light having an exposure wavelength of 230 to 260 nm is selectively employed for irradiation by using a cut filter. Then, as shown in FIG. 9E, the photodegradable positive type resist layer 221 composed of P(MMA-MAA) is developed by using a development liquid having the following composition, and a desired pattern is formed.

Development Liquid:
diethylene glycol monobutyl ether: 60 vol %
ethanol amine: 5 vol %
morpholine: 20 vol %
ion exchange water: 15 vol %

Next, as shown in FIG. 9F, patterning (the exposing and developing) of the lower positive resist layer 203 of PMIPK is performed. The same exposure apparatus is employed, and light having an exposure wavelength of 270 to 330 nm is employed to selectively perform irradiation using a cut filter. The development is made by methyl isobutyl ketone. Then, as shown in FIG. 9G, resin composite 1 used in the first embodiment is employed to form a discharge port formation layer 204, so that the lower positive type resist layer 203 and the upper positive type resist layer 221 that have been patterned are covered.

For forming this layer 204, resin composite 1 is dissolved in a solvent mixture of methyl isobutyl ketone and xylene at a density of 60 mass %, and the resultant liquid is applied to the substrate using spin coating. The prebaking is made by using a hot plate at 90° C. for three minutes. Mask aligner MPA-600 FA, by Canon Inc., is employed as an exposure apparatus, and an exposure of 3J/cm$^2$ is performed. The structure is thereafter immersed in xylene for sixty seconds for developing, and is then baked at 100° C. for one hour in order to increase the adhesion of the discharge port formation material. Thereafter, the pattern exposure and development of an ink discharge port 209 is performed for the discharge port formation material 204. An arbitrary exposure apparatus can be employed for the pattern exposure, and although not shown, a mask that prevents light from being projected onto a portion that is to be an ink discharge port is employed during the exposure process.

Sequentially, although not shown, a cyclized isoprene is coated on the flow path structure material layer to protect the material layer from an alkaline solution. For this material, OBC, marketed by Tokyo Ohka Kogyo Co., Ltd., is employed. Then, the silicon substrate is immersed in a tetramethylammonium hydride (TMAH) solution having a 22 mass % at 83° C. for 13 hours, and through holes (not shown) for ink supply are formed. Furthermore, silicon nitride, used as a mask and membrane for forming ink supply holes, is patterned in advance in the silicon substrate. After this anisotropic etching has been completed, the silicon substrate is mounted on a dry etching apparatus with the reverse face on top, and the membrane film is removed using an etchant wherein oxygen, 5%, is mixed with $CF_4$. Then, the silicon substrate is immersed in xylene to remove the OBC.

Next, as shown in FIG. 9H, by using a low pressure mercury lamp, ionizing radiation 208 in the wavelength area 300 nm or lower is projected onto the entire substrate through the discharge port formation material 204, and the upper positive type resist of PMIPK and the lower positive type resist of P(MMA-MAA) are decomposed. The amount of ionizing radiation is 50J/cm².

Thereafter, the silicon substrate 202 is immersed in methyl lactate to collectively remove the mold resist, as shown in the vertical cross-sectional view in FIG. 9I. At this time, the silicon substrate 202 is placed in a megasonic tub of 200 MHz in order to reduce the elution time. Through this process, an ink flow path 211 including a discharge port is formed, and thus, an ink discharge element is obtained whereby ink from each ink flow path 211 is introduced to each discharge chamber through an ink supply hole 210, and is discharged from a discharge port 209 by a heater. The size of the obtained discharge port 209 is φ6 μm, and the OH height is 25 μm. Since the flow path height is 15 μm, and the thickness of the P(MMA-MAA) film formed on the heater is 5 μm, the OP thickness is 5 μm.

(Fifth Embodiment)

Figure 10:
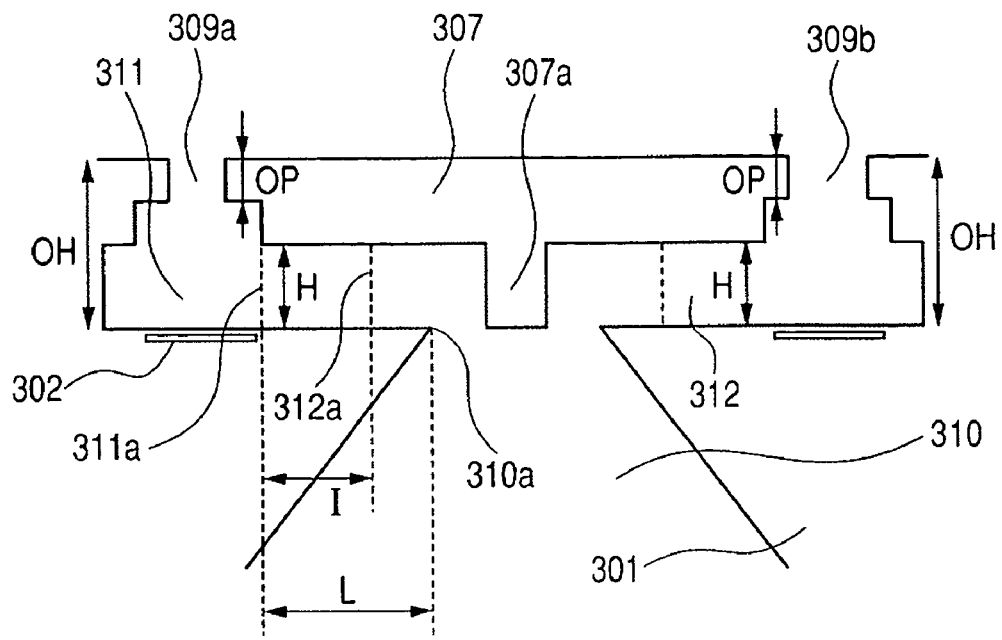
FIG. 10 is an explanatory cross-sectional view of an ink jet head according to a fifth embodiment of the present invention.

An ink jet head having the structure shown in FIG. 10 is manufactured using the method of the fourth embodiment of the present invention. According to a fifth embodiment of this invention, as shown in FIG. 10, the horizontal distance (L) from an opening edge 310a of an ink supply port 310 to an end 311a of a discharge chamber 311 at an ink supply port side, is 80 μm. An ink flow path wall 312 is formed at a distance (312a) of 50 μm toward the ink supply port 310 side from the end 311a of the discharge chamber 311 at the ink supply port side, and divides individual discharge elements. Further, the ink flow path height (H) is 15 μm, and the distance (OH) from the surface of a substrate 301 to the surface of a discharge port formation material 307 is 26 μm. As shown in FIG. 10, the sizes of ink discharge ports 309a and 309b, arranged with the ink supply port located between them, are respectively φ6 μm and φ12 μm, and heaters are arranged in consonance with the amount of ink discharged. The amount of ink discharged by the individual discharge ports are 0.5 pl and 2.0 pl. 256 nozzles are arranged in a zigzag manner (not shown) at a pitch of 42.3 μm in the perpendicular direction relative to the plane of the paper in FIG. 10. It should be noted that in FIG. 10 reference numeral 302 denotes a heater and 307a denotes a beam provided for the discharge port formation material 307. The OP thickness (OP) is 5 μm.

(Sixth Embodiment)

Figure 11:
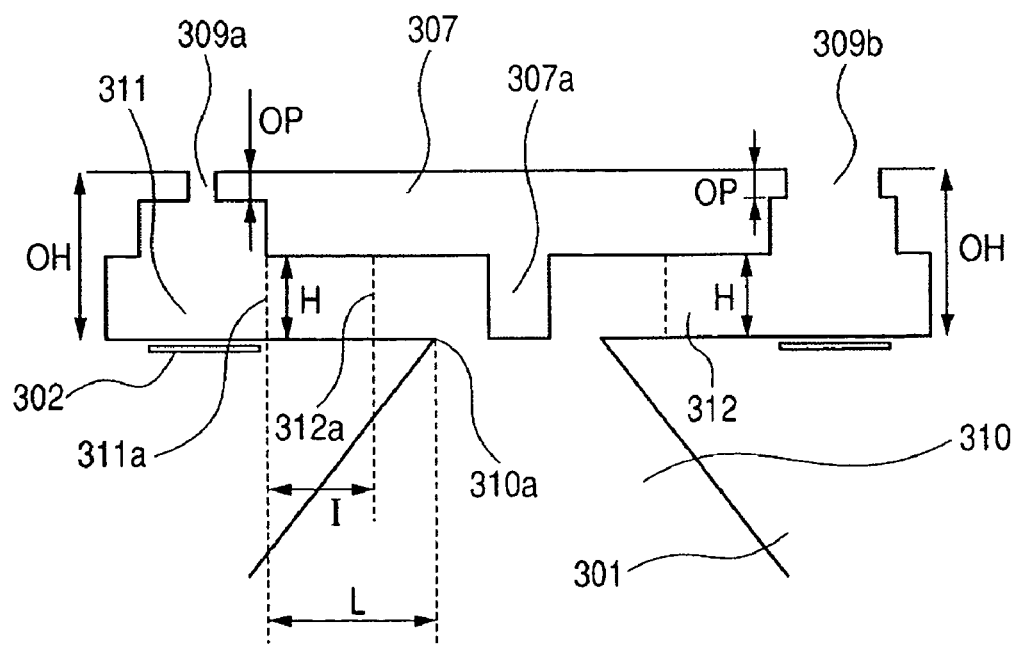
FIG. 11 is an explanatory cross-sectional view of an ink jet head according to a sixth embodiment of the present invention.

An ink jet head having a structure shown in FIG. 11 is manufactured using the method according to the fourth embodiment. According to a sixth embodiment of the present invention, as shown in FIG. 11, the horizontal distance (L) from an opening edge 310a of an ink supply port 310 to an end 311a of a discharge chamber 311 at an ink supply port side, is 80 μm. An ink flow path wall 312 is formed at a distance (312a) of 50 μm toward the ink supply port 310 side from the end 311a of the discharge chamber 311 at the ink supply port side, and separates individual discharge elements. Further, the ink flow path height (H) is 15 μm, and the distance (OH) from the surface of a substrate 301 to the surface of a discharge port formation material 307 is 25 μm. As shown in FIG. 11, the sizes of ink discharge ports 309a and 309b, arranged with the ink supply port located between them, are respectively φ3 μm and φ16 μm, and heaters are arranged in consonance with the amount of ink discharged. The amounts of ink discharged by the individual discharge ports are 0.2 pl and 5.0 pl. 256 nozzles are arranged in a zigzag manner (not shown) at a pitch of 42.3 μm, in the perpendicular direction relative to the plane of the paper in FIG. 11. It should be noted that in FIG. 11, reference numeral 302 denotes a heater, and 307a denotes a beam provided for the discharge port formation material 307. The OP thickness (OP) is 5 μm (Seventh Embodiment)

Figure 12:
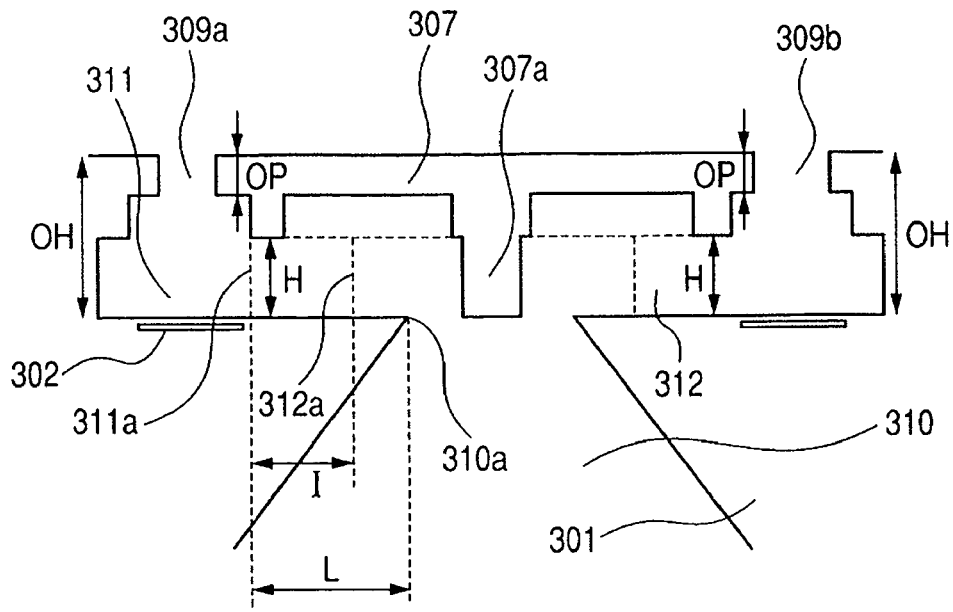
FIG. 12 is an explanatory cross-sectional view of an ink jet head according to a seventh embodiment of the present invention.
Figure 13A:
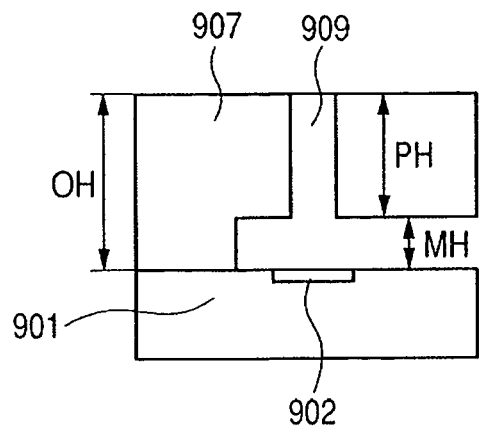
FIGS. 13A, 13B and 13C are schematic cross-sectional views of a conventional nozzle shape for discharging small droplets.
Figure 13B:
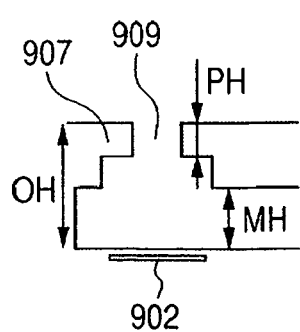
Figure 13C:
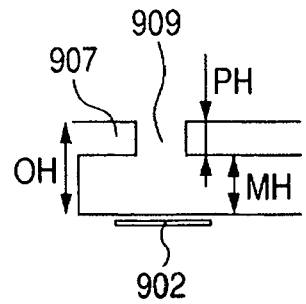

An ink jet head having a structure shown in FIG. 12 is manufactured by the method according to the fourth embodiment. According to a seventh embodiment of the present invention, as shown in FIG. 12, the horizontal distance (L) from an opening edge 310a of an ink supply port 310 to an end 311a of a discharge chamber 311 at an ink supply port side is 80 μm. An ink flow path wall 312 is formed at a distance (312a) of 50 μm toward the ink supply port 310 side from the end 311a of the discharge chamber 311 at the ink supply port side, and divides individual discharge elements. Further, the ink flow path height (H) is 15 μm, and the distance (OH) from the surface of a substrate 301 to the surface of a discharge port formation material 307 is 26 μm. As shown in FIG. 12, the sizes of ink discharge ports 309a and 309b arranged with the ink supply port arranged between them are respectively φ7 μm and μ11 μm, and heaters are arranged in consonance with the amount of discharged ink. The amounts of ink discharged by the individual discharge ports are 0.6 pl and 2.0 pl. 256 nozzles are arranged in a zigzag manner (not shown) at the pitch of 42.3 μm in the perpendicular direction relative to the plane of paper in FIG. 12. The OP thickness (OP) is 5 μm (Confirmation of Effects of the Present Invention)

In order to confirm the effects obtained by the invention, in the first embodiment, IJ heads for IJ printers (PIXUS560i by Canon Inc.) were produced as (1) a mode wherein a positive type resist composite that contains a copolymer of methacrylic acid and methyl methacrylate as a resin element is employed as a solid layer formation material; (2) a mode wherein polymethylisopropenylketone (ODUR) is employed as a solid layer formation material; and (3) a mode wherein a positive type resist composite in which triethanolamine of 0.1 weight % is added to polymethylisopropenylketone (ODUR) is employed as the solid layer formation material. The arrangement other than the solid layer formation material is the same as those in the first embodiment. The nozzle shapes for the prepared IJ heads are as shown in Table 1.

TABLE 1

|  | Solid layer material | Flow path height (Solid layer thickness) | OP thickness | Discharge port diameter |
|---|---|---|---|---|
| Structure of the present invention | PMMA copolymer | 15 μm | 6 μm | φ8 μm |
| Comparison 1 | ODUR | 15 μm | 6 μm | φ8 μm |
| Comparison 2 | ODUR + triethanolamine | 15 μm | 6 μm | φ8 μm |

These heads were mounted on IJ printers, and dot misalignment values were evaluated based on the arrays of dots formed on paper. The results are shown in Table 2.

TABLE 2

|  | Solid layer material | Printing yield |
|---|---|---|
| Structure of the present invention | PMMA copolymer | 96% |
| Comparison 1 | ODUR | 40% |
| Comparison 2 | ODUR + triethanolamine | 55% |

* Printing yield: in the printing inspection using a printer, a value of (m/n) × 100 wherein n denotes the number of heads (n) in the head assembly, and m denotes the number of heads whose dot misalignment value is s and is within 5 μm.

While referring to Table 2, dot misalignment of printing that seemed to be affected by the scum occurred in the IJ heads with the structures other than that of the present invention. A printing failure that occurred in the IJ head with the structure of the invention was a phenomenon (called a non-discharge phenomenon) wherein ink droplets do not fly from one part of nozzles due to dust that entered in the head assembly process (mounting process).

As is described above, according to the present invention, since the inhibitor of cationic photopolymerization is mixed with a photocurable composite that is a discharge port formation material to be used through cationic polymerization, and a portion that is to be a discharge port and a solid layer that serves an interface are deposited using a copolymer of methacrylic acid and methyl methacrylate Therefore, the manufacturing steps are substantially unchanged compared with the conventional steps, and an inexpensive ink jet head with no scum can be provided. Furthermore, two solid layers are provided, and a vinylketone photodegradable macromolecule compound or polymethylisopropenylketone is employed for the lower layer, while a copolymer of methacrylic acid and methacrylate ester is employed for the upper layer, and the discharge port formation material contains at least a cationically polymerizable chemical compound, cationic photopolymerization initiator and an inhibitor of cationic photopolymerization. As a result, an inexpensive liquid ejection head can be provided for which the manufacturing steps are substantially unchanged compared with the conventional steps and no scum occurs, and wherein an intermediate chamber that is smaller than the flow path portion on the substrate side that reduces—the liquid flow resistance is accurately formed along the flow path under the discharge port.

This application claims priority from Japanese Patent Application No. 2004-190483 filed Jun. 28, 2004, which is hereby incorporated by reference herein.

The invention claimed is:

1. A method for manufacturing a liquid discharge head including a substrate, on which is arranged an energy generating element to generate energy used to discharge liquid from a discharge port, and a flow path communicating with the energy generating element and the discharge port, the method comprising the steps of:
   providing a positive type photosensitive material layer containing a copolymer of methacrylic acid and methacrylate ester on the substrate in a diglyme solvent;
   forming a solid layer for forming the flow path from the positive type photosensitive material layer on the substrate;
   forming, on the substrate where the solid layer is formed, a coating resin layer containing a cationically polymerizable resin, a basic material having a pair of nonshared electrons and a solvent containing xylene and methyl isobutyl ketone for coating the solid layer, the basic material selected from the group consisting of diethanolamine, triethanolamine, triisopropanolamine, a pyrimidine compound, a pyridine compound, and aminophenol;
   forming the discharge port, through a photolithographic process, in the coating resin layer formed on the solid layer; and
   removing the solid layer to form the flow path.

2. A method according to claim 1, wherein the boundary between the solid layer and the coating resin layer is formed of a copolymer of methacrylic acid and methyl methacrylate.

3. A method according to claim 1, wherein the copolymer of methacrylic acid and methacrylate ester has a weight average molecular weight of 50000 to 300000 and a ratio of a content of methacrylic acid of 5 to 30 weight%.

4. A method according to claim 1, wherein the step of forming the solid layer includes the steps of:
   forming, on the substrate, a first positive type photosensitive material layer that is exposed to ionizing radiation of a first wavelength,
   forming, on the first positive type photosensitive material layer, a second positive type photosensitive material layer that is exposed to ionizing radiation of a second wavelength that is different from the first wavelength,
   irradiating the ionizing radiation of the second wavelength to the substrate where the first and the second positive type photosensitive material layers are formed, and forming a desired pattern on the second positive type photosensitive material layer, and
   irradiating the ionizing radiation of the first wavelength to the substrate where the first and the second positive type photosensitive material layers are formed, and forming a desired pattern on the first positive type photosensitive material layer, and
   wherein the second positive type photosensitive material layer forms the boundary with the coating resin layer.

5. A method according to claim 4, wherein a material for forming the first positive type photosensitive material layer contains polymethylisopropenylketone.

6. A method according to claim 3, wherein the step of forming the solid layer comprises:
   providing on the substrate a layer of the positive type photosensitive material layer containing the copolymer of methacrylic acid and methacrylate ester;
   heating the positive type photosensitive material layer at 120 to 150° C.; and
   after the heating forming the solid layer by patterning the positive type photosensitive material layer.

7. A method according to claim 3, wherein the step of forming the solid layer comprises:
   providing on the substrate a layer of the positive type photosensitive material layer containing the copolymer of methacrylic acid and methacrylate ester with the solvent of diglyme;
   heating the positive type photosensitive material layer at 120 to 150° C.; and
   after the heating, forming the solid layer by patterning the positive type photosensitive material layer.

* * * * *